(12) United States Patent
Shin et al.

(10) Patent No.: US 9,778,979 B2
(45) Date of Patent: Oct. 3, 2017

(54) STORAGE DEVICE INCLUDING ERROR CORRECTION DECODER AND OPERATING METHOD OF ERROR CORRECTION DECODER

(71) Applicants: Dong-Min Shin, Seoul (KR); Myungkyu Lee, Seoul (KR); Beom Kyu Shin, Seongnam-si (KR); Kijun Lee, Seoul (KR)

(72) Inventors: Dong-Min Shin, Seoul (KR); Myungkyu Lee, Seoul (KR); Beom Kyu Shin, Seongnam-si (KR); Kijun Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 92 days.

(21) Appl. No.: 14/800,012

(22) Filed: Jul. 15, 2015

(65) Prior Publication Data
US 2016/0055057 A1    Feb. 25, 2016

(30) Foreign Application Priority Data

Aug. 25, 2014  (KR) .................. 10-2014-0110848

(51) Int. Cl.
| | | |
|---|---|---|
| H03M 13/00 | (2006.01) | |
| G06F 11/10 | (2006.01) | |
| H03M 13/11 | (2006.01) | |
| G11C 29/04 | (2006.01) | |

(52) U.S. Cl.
CPC ....... *G06F 11/1012* (2013.01); *H03M 13/114* (2013.01); *H03M 13/1122* (2013.01); *H03M 13/6577* (2013.01); *G11C 2029/0411* (2013.01)

(58) Field of Classification Search
None
See application file for complete search history.

(56) References Cited

U.S. PATENT DOCUMENTS

| | | |
|---|---|---|
| 7,373,585 B2 | 5/2008 | Yedidia et al. |
| 7,376,885 B2 | 5/2008 | Richardson et al. |
| 7,679,133 B2 | 3/2010 | Son et al. |

(Continued)

OTHER PUBLICATIONS

Zhiqiang Cui et al., "Efficient Decoder Design for High-Throughput LDPC Decoding", 2008 IEEE, pp. 1640-1643.

(Continued)

*Primary Examiner* — Daniel McMahon
(74) *Attorney, Agent, or Firm* — Volentine & Whitt, PLLC

(57) ABSTRACT

An operating method of an error correction decoder includes receiving data, setting initial log-likelihood values of variable nodes, and decoding the received data by updating a log-likelihood value of a selected variable node by use of a minimum value and a minimum candidate value associated with the selected variable node. The minimum value indicates a minimum value of absolute values of log-likelihood values of first variable nodes sharing a check node with the selected variable node and including the selected variable node. The minimum candidate value indicates one from among absolute values of log-likelihood values of second variable nodes that has the smallest value greater than the minimum value. The second variable nodes are selected later than one from among the first variable nodes corresponding to the minimum value.

20 Claims, 24 Drawing Sheets

(56) References Cited

U.S. PATENT DOCUMENTS

| | | | |
|---|---|---|---|
| 8,151,171 | B2 | 4/2012 | Blanksby |
| 8,234,320 | B1 * | 7/2012 | Yeo .................. G06F 7/544 |
| | | | 708/207 |
| 8,266,493 | B1 | 9/2012 | Abbaszadeh et al. |
| 8,291,292 | B1 | 10/2012 | Varnica et al. |
| 8,489,962 | B2 | 7/2013 | Dielissen |
| 8,553,466 | B2 | 10/2013 | Han et al. |
| 8,559,235 | B2 | 10/2013 | Yoon et al. |
| 8,601,352 | B1 | 12/2013 | Anholt et al. |
| 8,654,587 | B2 | 2/2014 | Yoon et al. |
| 9,325,347 | B1 * | 4/2016 | Graumann ......... H03M 13/1128 |
| 2009/0070659 | A1 | 3/2009 | Zhong et al. |
| 2009/0164540 | A1 * | 6/2009 | Oh ..................... H03M 13/112 |
| | | | 708/207 |
| 2010/0205506 | A1 * | 8/2010 | Hara ................... H03M 5/145 |
| | | | 714/755 |
| 2011/0233648 | A1 | 9/2011 | Seol et al. |
| 2012/0030541 | A1 * | 2/2012 | Okamura ......... H03M 13/1117 |
| | | | 714/758 |
| 2012/0033767 | A1 | 2/2012 | Wilborn et al. |
| 2013/0051444 | A1 | 2/2013 | Roh |
| 2013/0212447 | A1 | 8/2013 | Li et al. |
| 2014/0053037 | A1 | 2/2014 | Wang et al. |
| 2014/0082448 | A1 | 3/2014 | Zhang et al. |
| 2015/0303944 | A1 * | 10/2015 | Sunwoo ............. H03M 13/1131 |
| | | | 714/752 |

OTHER PUBLICATIONS

Jun Lin et al., "An Improved MIN-SUM Based Column-Layered Decoding Algorithm for LDPCCODES", 2009 IEEE, pp. 238-242.

Z. Cui et al., "Reduced-complexity column-layered decoding and implementation for LDPC codes", IET Commun., 2011, vol. 5, Iss. 15, pp. 2177-2186.

C'edric Marchand et al., "Architecture and finite precision optimization for layered LDPC decoders", Architecture and finite precision optimization for layered LDPC decoders.

Chuan Zhang et al., "Low-Latency Low-Complexity Channel Decoder Architectures for Modern Communications Systems", Dec. 2012.

* cited by examiner

| Sample | LLR | Example LLR |
|---|---|---|
| 111 | −M4 | −4 |
| 110 | −M3 | −3 |
| 101 | −M2 | −2 |
| 100 | −M1 | −1 |
| 011 | +M1 | +1 |
| 010 | +M2 | +2 |
| 001 | +M3 | +3 |
| 000 | +M4 | +4 |

STORAGE DEVICE INCLUDING ERROR CORRECTION DECODER AND OPERATING METHOD OF ERROR CORRECTION DECODER

CROSS-REFERENCE TO RELATED APPLICATIONS

A claim for priority under 35 U.S.C. §119 is made to Korean Patent Application No. 10-2014-0110848 filed Aug. 25, 2014, in the Korean Intellectual Property Office, the entire contents of which are hereby incorporated by reference.

BACKGROUND

The technology described herein relates to a semiconductor circuit, and more particularly, relates to a storage device including an error correction decoder and an operating method of the error correction decoder.

A storage device is a device that stores data according to the control of a host device, such as a computer, a smart phone, and a smart pad. The storage device may contain a device (e.g., Hard Disk Drive), which stores data on a magnetic disk, or a semiconductor memory, such as Solid State Drive or memory card, in particular, a device which stores data on a nonvolatile memory.

A nonvolatile memory may be ROM (Read Only Memory), PROM (Programmable ROM), EPROM (Electrically Programmable ROM), EEPROM (Electrically Erasable and Programmable ROM), flash memory, PRAM (Phase-change RAM), MRAM (Magnetic RAM), RRAM (Resistive RAM), or FRAM (Ferroelectric RAM).

With the advancement of semiconductor fabrication technology, the degree of integration and capacity of the storage device continue to increase. The high integration of the storage device has the production cost of the storage device lowered. However, various problems that are not conventionally detected are detected as the storage device is scaled down due to the high integration of the storage device. For example, an error rate of data stored at the storage device increases due to the progress of the high integration of the storage device.

A variety of error correction decoders may be used to correct an error of data stored at the storage device. Critical factors of an error correction decoder may include the following: error correction capacity, error correction speed, complexity, and size. Conventionally, if the error correction capacity is improved, the complexity or size may also increase, thereby causing a decrease in the error correction speed.

A new method and device for realizing improved error correction capacity, improved error correction speed, reduced complexity, and reduced size may be required to improve operating performance of an error correction decoder and a storage device including the same.

SUMMARY

One aspect of embodiments of the application is directed to providing an operating method of an error correction decoder based on a low density parity check. The method includes receiving data; setting initial log-log-likelihood values of variable nodes depending on the received data; and decoding the received data by updating a log-log-likelihood value of a selected variable node by use of a minimum value and a minimum candidate value associated with the selected variable node. The minimum value indicates a minimum value of absolute values of log-log-likelihood values of first variable nodes sharing a check node with the selected variable node and including the selected variable node. The minimum candidate value indicates one, greater than the minimum value and smallest, from among absolute values of log-log-likelihood values of second variable nodes that are selected later than one, corresponding to the minimum value, from among the first variable nodes.

In exemplary embodiments, a log-log-likelihood value of the selected variable node is updated additionally using a minimum value position and a minimum candidate value position. The minimum value position indicates a position of one, corresponding to the minimum value and being selected last, from among the first variable nodes. The minimum candidate value position indicates a position of one, corresponding to the minimum candidate value and being selected last, from among the second variable nodes.

In exemplary embodiments, the decoding the received data includes detecting the minimum value and the minimum candidate value from the initial log-likelihood values of the first variable nodes when the selected variable node is one, first updated, from among the first variable nodes.

In exemplary embodiments, the decoding the received data further includes detecting a second minimum candidate value, greater than the minimum candidate value and smallest, from among absolute values of log-likelihood values of third variable nodes that are selected later than one, corresponding to the minimum candidate value, from among the second variable nodes. Additionally, the decoding includes detecting a K-th minimum candidate value, greater than a $K-1^{st}$ minimum candidate value and smallest, from among log-likelihood values of $K+1^{st}$ variable nodes that are selected later than one, corresponding to the $K-1^{st}$ minimum candidate value, from among K-th variable nodes (K being a positive integer of 3 or more). The detecting a K-th minimum candidate value is repeated until the number of the minimum candidate values and the minimum value reaches a number of different absolute values of log-likelihood values of each variable node.

In exemplary embodiments, the decoding the received data includes calculating a first message corresponding to the selected variable node using the minimum value, the minimum value position, the minimum candidate value, and the minimum candidate value position; updating a log-likelihood value of the selected variable node depending on the first message; and updating the minimum value, the minimum value position, the minimum candidate value, and the minimum candidate value position according to an updating result of the log-likelihood value of the selected variable node.

In exemplary embodiments, the calculating a first message includes calculating the minimum candidate value as the first message when a position of the selected variable node is identical to the minimum value position; and calculating the minimum value as the first message when a position of the selected variable node is different from the minimum value position.

In exemplary embodiments, the updating a log-likelihood value of the selected variable node includes calculating a second message associated with another check node to which the selected variable node belongs; and updating the log-likelihood value of the selected variable node with a value obtained by calculating an initial log-likelihood value of the selected variable node, the first message, and the second message.

In exemplary embodiments, the second message is calculated in the same way as the first message, using log-likelihood values of variable nodes sharing the other check node with the selected variable node and including the selected variable node.

In exemplary embodiments, in the updating the minimum value, the minimum value position, the minimum candidate value, and the minimum candidate value position, the minimum value and the minimum value position are set to have contents of the minimum candidate value and contents of the minimum candidate value position when a position of the selected variable node is identical to the minimum value position.

In exemplary embodiments, in the updating the minimum value, the minimum value position, the minimum candidate value, and the minimum candidate value position, when a position of the selected variable node is identical to the minimum value position, the minimum candidate value and the minimum candidate value position are set to have contents of a second minimum candidate value and contents of a second minimum candidate value position. A K-th minimum candidate value and a K-th minimum candidate value position are set to have contents of a K+$1^{st}$ minimum candidate value and contents of a K+$1^{st}$ minimum candidate value position. A last minimum candidate value and a last minimum candidate value position are reset (K being a positive integer of 2 or more). The K-th minimum candidate value is one, greater than a K−$1^{st}$ minimum candidate value and smallest, from among absolute values of log-likelihood values of variable nodes selected later than a variable node, corresponding to a K−$1^{st}$ minimum candidate value, from among the first variable nodes. The K-th minimum candidate value position indicates a position of one, having the K-th minimum candidate value and most recently updated, from among the first variable nodes.

In exemplary embodiments, in the updating the minimum value, the minimum value position, the minimum candidate value, and the minimum candidate value position, when a position of the selected variable node is identical to the minimum candidate value position, the minimum candidate value and the minimum candidate value position are set to have contents of a second minimum candidate value and contents of a second minimum candidate value position. The second minimum candidate value is one, greater than the minimum candidate value and smallest, from among log-likelihood values of variable nodes, selected later than the minimum candidate value, from among the first variable nodes. The second minimum candidate value position indicates a position of one, having the second minimum candidate value and most recently updated, from among the first variable nodes.

In exemplary embodiments, in the updating the minimum value, the minimum value position, the minimum candidate value, and the minimum candidate value position, when the updated log-likelihood value of the selected variable node is smaller than or equal to the minimum value, the minimum value is updated with the updated log-likelihood value, the minimum value position is updated with a position of the selected variable node, and the minimum candidate value and the minimum candidate value position are reset.

In exemplary embodiments, in the updating the minimum value, the minimum value position, the minimum candidate value, and the minimum candidate value position, when the updated log-likelihood value of the selected variable node is greater than the minimum value and smaller than or equal to the minimum candidate value, the minimum candidate value is updated with the updated log-likelihood value, the minimum candidate value position is updated with a position of the selected variable node, and K-th through last minimum candidate values and K-th through last minimum candidate value positions are reset (K being an integer of 2 or more). The K-th minimum candidate value is one, greater than a K−$1^{st}$ minimum candidate value and smallest, from among absolute values of log-likelihood values of variable nodes selected later than a variable node, corresponding to a K−$1^{st}$ minimum candidate value, from among the first variable nodes. The K-th minimum candidate value position indicates a position of one, having the K-th minimum candidate value and most recently updated, from among the first variable nodes.

In exemplary embodiments, the decoding is iterated while sequentially selecting the variable nodes. When data corresponding to the updated log-likelihood values of the variable nodes is error-corrected data, the error-corrected data is output. When data corresponding to the updated log-likelihood values of the variable nodes is not the error-corrected data, the decoding is again iterated while sequentially selecting the variable nodes.

Another aspect of embodiments of the application is directed to provide a storage device which includes a nonvolatile memory; and an error correction decoder adapted to correct an error of data read from the nonvolatile memory. The error correction decoder includes a log-likelihood value generator adapted to set initial log-likelihood values of variable nodes according to the read data; a first message generator adapted to update log-likelihood values of the variable nodes according to the initial log-likelihood values from the log-likelihood value generator and second messages and output the updated log-likelihood values as first messages; a check node updater adapted to store a minimum value and a minimum candidate value, corresponding to each check node, from among the log-likelihood values of the first messages and update the minimum value and the minimum candidate value corresponding to each check node according to the first messages; and a second message generator adapted to generate the second messages using the minimum value and the minimum candidate value corresponding to each check node. The minimum value indicates a minimum value of absolute values of log-likelihood values of first variable nodes sharing a check node, and the minimum candidate value indicates one, greater than the minimum value and smallest, from among absolute values of log-likelihood values of second variable nodes that are selected later than one, corresponding to the minimum value, from among the first variable nodes.

In exemplary embodiments, when the initial log-likelihood values are first received from the log-likelihood value generator, the first message generator outputs the initial log-likelihood values as the first messages. The first message generator calculates the initial log-likelihood values and the second messages to again output the first messages.

In exemplary embodiments, the error correction decoder updates a log-likelihood value of a first variable node depending on the first variable node and two or more check nodes associated with the first variable node and then updates a log-likelihood value of a second variable node depending on the second variable node and two or more check nodes associated with the second variable node. The updated log-likelihood value of the first variable node is used upon updating of the log-likelihood value of the second variable node.

In exemplary embodiments, the check node updater stores the minimum value, the minimum candidate value, a minimum value position, and a minimum candidate value position corresponding to each check node. The minimum value position indicates a position of one, corresponding to the minimum value and being selected last, from among the first variable nodes. The minimum candidate value position indicates a position of one, corresponding to the minimum candidate value and being selected last, from among the first variable nodes.

In exemplary embodiments, the second message generator compares a position of a selected variable node with minimum value positions of check nodes associated with the selected variable node. The second message generator outputs the minimum candidate value of the check node as a second message of the check node when a minimum value position of a check node connected with the selected variable node is identical to a position of the variable node. The second message generator outputs the minimum value of the check node as the second message of the check node when the minimum value position of the check node connected with the selected variable node is different from the position of the variable node.

In exemplary embodiments, the check node updater compares an updated log-likelihood value of a selected variable node with minimum candidate values and minimum values of check nodes associated with the selected variable node. The check node updater updates a minimum value of a check node with the updated log-likelihood value when the updated log-likelihood value is smaller than or equal to the minimum value of the check node. The check node updater updates a minimum candidate value of a check node with the updated log-likelihood value when the updated log-likelihood value is greater than the minimum value of the check node and smaller than or equal to the minimum candidate value of the check node.

Another aspect of embodiments of the application is directed to provide a low density parity check method of an error correction decoder. The method includes associating each of k ckeck nodes with multiple ones of n variable nodes according to bit values of a parity check matrix, such that: (1) each of the variable nodes represents a different column of the matrix and each of the check nodes represents a different row of the matrix, (2) for each row of the matrix, every true bit value in the row indicates that the variable node representing the column in which the true bit value exists is associated with the check node representing the row, (3) for each row of the matrix, every false bit value in the row indicates that the variable node representing the column in which the false bit value exists is not associated with the check node representing the row, (4) each variable node is associated with at least two check nodes, and (5) n and k are integers such that n>k. The method further includes storing a log-likelihood value of each of n bits of a bit string in a different one of the variable nodes. Still further, the method includes: (a) sequentially updating the log-likelihood value stored in each variable node, in a loop that begins with a $1^{st}$ variable node and ends with a $n^{th}$ variable node, based upon an update value provided by each check node associated with the variable node and (b) determining whether the n updated log-likelihood values represent an n-bit codeword having no detected bit errors. Operations (a) and (b) are repeated until a determination is made that an n-bit codeword having no detected bit errors exists or a predetermined number of loops has occurred. The absolute value of the update value provided by each check node is never less than the absolute value of the smallest log-likelihood value presently stored in any one of the variable nodes associated with the check node.

In exemplary embodiments, each log-likelihood value stored in a variable node is updated, during a loop, with a value obtained by summing the update values provided by the check nodes with which the variable node is associated.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
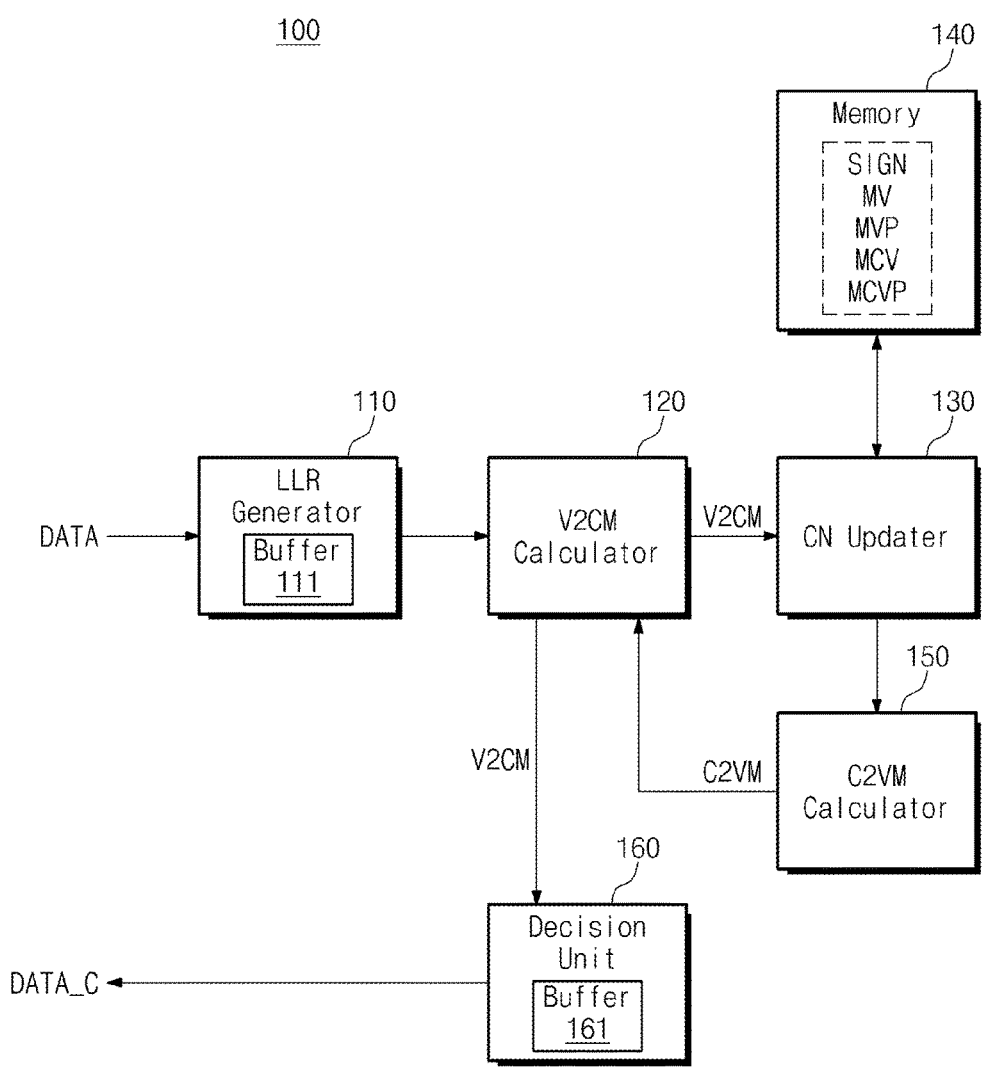
FIG. 1 is a block diagram schematically illustrating an error correction decoder according to an embodiment of the application.

Embodiments will be described in detail with reference to the accompanying drawings. The application, however, may be embodied in various different forms, and should not be construed as being limited only to the illustrated embodiments. Rather, these embodiments are provided as examples so that this disclosure will be thorough and complete, and will fully convey the concept of the application to those skilled in the art. Accordingly, known processes, elements, and techniques are not described with respect to some of the embodiments of the application. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the application.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the application. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating an error correction decoder 100 according to an embodiment of the application. Referring to FIG. 1, an error correction decoder 100 includes a log-likelihood value (hereinafter referred to as "LLR") generator 110, a first message (e.g., V2CM) calculator 120, a check node (e.g., CN) updater 130, a memory 140, a second message (e.g., C2VM) calculator 150, and a decision unit 160.

The LLR generator 110 receives data DATA from an external device. The LLR generator 110 sets initial log-likelihood values LLR_I of variable nodes of the error correction decoder 100, based on the received data DATA. The log-likelihood value LLR may indicate a value of the log likelihood ratio. For example, the LLR generator 110 previously stores information about log-likelihood values assigned to patterns of the received data DATA. The LLR generator 110 sets the initial log-likelihood values LLR_I according to patterns of the received data DATA, using the previously stored information. The initial log-likelihood values LLR_I of variable nodes are stored at a buffer 111. The initial log-likelihood values LLR_I stored at the buffer 111 are transferred to the first message calculator 120.

The first message calculator 120 receives the initial log-likelihood values LLR_I from the LLR generator 110. For example, the first message calculator 120 receives the initial log-likelihood values LLR_I corresponding to the variable nodes. The first message calculator 120 receives a second message C2VM from the second message calculator 150. For example, the first message calculator 120 receives the second message C2VM that includes log-likelihood values transferred from check nodes, connected with a selected one of the variable nodes, to the selected variable node. The first message calculator 120 calculates one, corresponding to a selected variable node, from among the initial log-likelihood values LLR_I and log-likelihood values of the second message C2VM to update a log-likelihood value LLR of the selected variable node. The first message calculator 120 outputs an updated log-likelihood value of the selected variable node as a first message V2CM. For example, the first message V2CM may be a variable node to check node message to be transferred to at least one check node from the selected variable node. The first message V2CM is transferred to the check node updater 130 and the decision unit 160.

The check node updater 130 stores and manages signs SIGN of log-likelihood values of variable nodes and a minimum value MV, a minimum value position MVP, a minimum candidate value MCV, and a minimum candidate value position MCVP associated with each check node at the memory 140. The check node updater 130 updates the values SIGN, MV, MVP, MCV, and MCVP stored at the memory 140, based on the first message V2CM. The check node updater 130 sends at least one of the values MV, MVP, MCV, and MCVP stored at the memory 140 to the second message calculator 150.

For example, the minimum value MV may be the smallest one of absolute values of log-likelihood values of variable nodes (e.g., sharing variable nodes) sharing one check node. The minimum value position MVP may indicate a position of the last one, having the sharing variable nodes, for example, a position of a most recently updated variable node (or a position of a variable node to be updated last).

The minimum candidate value MCV may be one, being greater than the minimum value MV and smallest, from among absolute values of log-likelihood values of variable nodes, updated later than a variable node corresponding to the minimum value position MVP, from among the sharing variable nodes. The minimum candidate value position MCVP may indicate a position of the last variable node, which has the minimum candidate value MCV and is updated later than a variable node, corresponding to the minimum value position MVP, from among the sharing variable nodes, that is, a position of the most recently updated variable node (or a position of a variable node to be updated last).

For example, the minimum candidate value MCV includes first minimum candidate value MCV_1, a second minimum candidate value MCV_2, a K-th minimum candidate value MCV_K, and so on. The K-th minimum candidate value MCV_K may be one, greater than a K-1$^{st}$ minimum candidate value MCV_K-1 and smallest, from among absolute values of log-likelihood values of variable nodes, updated later than a variable node corresponding to a K-1$^{st}$ minimum candidate value position MCVP_K-1, from among the sharing variable nodes.

The minimum candidate value position MCVP includes a first minimum candidate value position MCVP_1, a second minimum candidate value position MCVP_2, a K-th minimum candidate value position MCVP_K, and so on. The K-th minimum candidate value position MCVP_K may indicate a position of the last variable node, having the K-th minimum candidate value MCV_K and updated later than the K-1$^{st}$ minimum candidate value position MCVP_K-1, from among the sharing variable nodes, that is, a position of the most recently updated variable node (or a position of a variable node to be updated last).

The second message calculator 150 outputs one of the minimum value MV and the minimum candidate value MCV associated with each check node to the first message calculator 120 as the second message C2VM associated with each check node. For example, the second message C2VM may be a check node to variable node message transferred from each check node, associated with a selected variable node, to the selected variable node.

The decision unit 160 receives the first message V2CM from the first message calculator 120. The decision unit 160 stores log-likelihood values of variable nodes at a buffer 161. The first message V2CM updates one, corresponding to the first message V2CM received, from among log-likelihood values stored at the buffer 161 by use of the first message V2CM received. The decision unit 160 determines whether an error exists at data corresponding to log-likelihood values stored at the buffer 161. As a consequence of determining that an error does not exist at data corresponding to log-likelihood values stored at the buffer 161, the decision unit 160 outputs data corresponding to log-likelihood values stored at the buffer 161 as error-corrected data DATA_C.

The error correction decoder 100 performs error correction based on the low density parity check (hereinafter referred to as "LDPC"). The error correction decoder 100 updates log-likelihood values by a unit of the variable node. For example, the second message calculator 150 outputs the second message C2VM corresponding to check nodes that are connected to a selected variable node. The first message calculator 120 updates a log-likelihood value LLR of a selected variable node depending on the initial log-likelihood values LLR_I and the second message C2VM. The updated log-likelihood value is output as the first message V2CM. The second message calculator 150 outputs the second message C2VM, corresponding to check nodes connected with a next variable node, depending on the updated log-likelihood value.

Error correction decoding according to a conventional flooding manner does not apply an updated log-likelihood value of a variable node to update a next variable node. In contrast, the error correction decoder 100 updates log-likelihood values by the variable node and applies the updated log-likelihood value to update a log-likelihood value LLR of a next variable node in real time, thereby making it possible to correct an error of data DATA1 faster. That is, error correction speed of the error correction decoder 100 is improved.

Error correction decoding according to a conventional shuffle manner updates a log-likelihood value LLR of each variable node by use of the whole log-likelihood values of variable nodes. In detail, the error correction decoding according to the conventional shuffle manner calculates the second message C2VM to be sent to each variable node by use of the whole log-likelihood values of variable nodes. In contrast, the error correction decoder 100 updates a log-likelihood value LLR of each variable node by use of the minimum value MV, the minimum value position MVP, the minimum candidate value MCV, and minimum candidate value position MCVP, not the whole log-likelihood values of variable nodes. The complexity and size of the error correction decoder 100 may be reduced because the whole log-likelihood values of variable nodes are not managed or calculated.

Error correction decoding according to a conventional shuffle and approximation manner discards a portion of the whole log-likelihood values of variable nodes and updates a log-likelihood value LLR of each variable node by use of the remaining log-likelihood values. That is, if a portion of the whole log-likelihood values is discarded through approximation, both error correction capacity and error correction speed decrease. In contrast, the error correction decoder 100 updates a log-likelihood value LLR of each variable node by use of the minimum value MV, the minimum value position MVP, the minimum candidate value MCV, and minimum candidate value position MCVP, not the whole log-likelihood values of variable nodes, but omission or approximation of log-likelihood values practically does not occur. Thus, both error correction capacity and error correction speed of the error correction decoder 100 are improved.

Below, an error correction decoding method of an error correction decoder 100 will be more fully described with reference to accompanying drawings.

Figure 2:
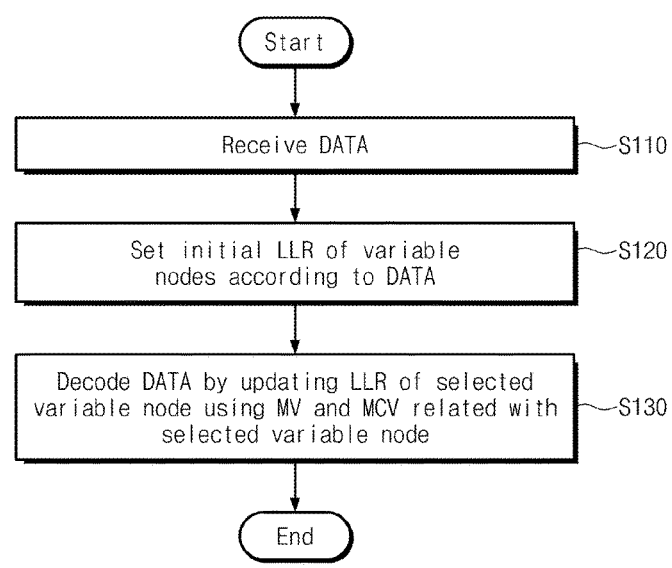
FIG. 2 is a flow chart showing an operating method of an error correction decoder according to an embodiment of the application.

FIG. 2 is a flow chart showing an operating method of an error correction decoder 100 according to an embodiment of the application. Referring to FIGS. 1 and 2, in step S110, an error correction decoder 100 receives data DATA. For example, an LLR generator 110 receives data DATA.

In step S120, initial log-likelihood values LLR_I of variable nodes are set according to the received data DATA. For example, the LLR generator 110 sets variable nodes with the initial log-likelihood values LLR_I by use of the received data DATA and previously stored information.

In step S130, an error correction decoder 100 decodes the received data DATA by updating a log-likelihood value LLR of a selected variable node by use of a minimum value MV and a minimum candidate value MCV associated with a selected variable node.

Figures 3, 4:
FIG. 3 is a table showing an embodiment of log-likelihood values set at variable nodes according to a sample pattern of data that an LLR generator receives.
FIGS. 4 and 5 show an embodiment where variable nodes and check nodes of an error correction decoder are formed.

FIG. 3 is a table showing an embodiment of log-likelihood values set at variable nodes according to a sample pattern of data DATA that an LLR generator 110 receives. In exemplary embodiments, a sample of received data DATA may be a source pattern for determining a final bit. For example, a sample of received data DATA may be a source pattern for determining whether a final bit is "1" or "0". A sample of the received data DATA may correspond to one bit read from a memory. An error correction decoder 100 may extract a final bit from a sample of the received data.

Referring to FIGS. 1 and 3, when a pattern of a sample of the received data is "111", the LLR generator 110 sets a variable node corresponding to the sample with "−M4" as an initial log-likelihood value LLR_I. When a pattern of a sample of the received data is "110", the LLR generator 110 sets a variable node corresponding to the sample with "−M3" as an initial log-likelihood value LLR_I. When a pattern of a sample of the received data is "101", the LLR generator 110 sets a variable node corresponding to the sample with "−M2" as an initial log-likelihood value LLR_I. When a pattern of a sample of the received data is "100", the LLR generator 110 sets a variable node corresponding to the sample with "−M1" as an initial log-likelihood value LLR_I.

When a pattern of a sample of the received data is "011", the LLR generator 110 sets a variable node corresponding to the sample with "+M1" as an initial log-likelihood value LLR_I. When a pattern of a sample of the received data is "010", the LLR generator 110 sets a variable node corresponding to the sample with "+M2" as an initial log-likelihood value LLR_I. When a pattern of a sample of the received data is "001", the LLR generator 110 sets a variable node corresponding to the sample with "+M3" as an initial log-likelihood value LLR_I. When a pattern of a sample of the received data is "000", the LLR generator 110 sets a variable node corresponding to the sample with "+M4" as an initial log-likelihood value LLR_I. That is, the LLR generator 110 sets a pair of values, having different signs and the same value, as initial log-likelihood values LLR_I.

For simple description of the spirit and scope of the application, it is assumed that initial log-likelihood values LLR_I are "−4", "−3", "−2", "−1", "1", "2", "3", and "4". However, the scope and spirit of the application may not be limited thereto. Each of the initial log-likelihood values LLR_I may be a real number.

Figure 5:
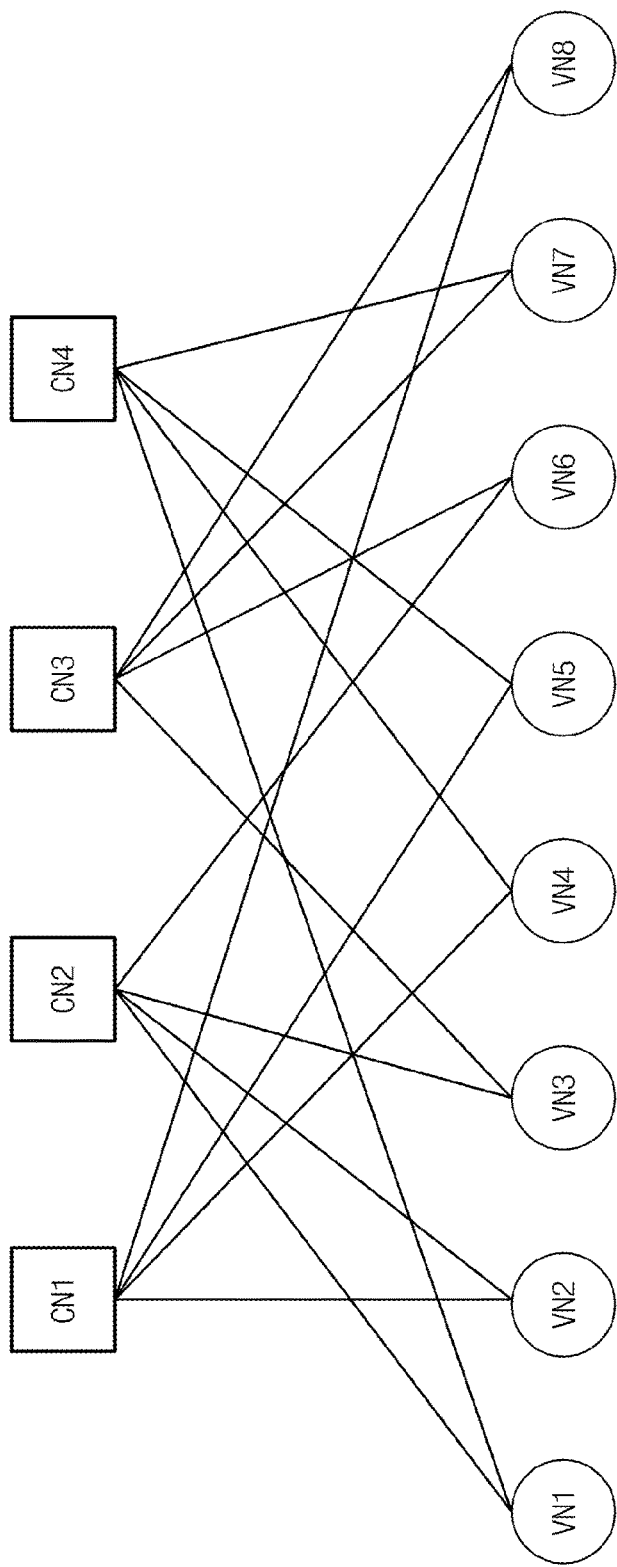

FIGS. 4 and 5 show an embodiment where variable nodes and check nodes of an error correction decoder 100 are formed. Variable nodes and check nodes of an error correction decoder 100 are formed based on a parity check matrix H of an LDPC code. In FIG. 4, there is illustrated an example of the parity check matrix H. Referring to FIGS. 1 and 4, the parity check matrix H includes $1^{st}$ through $4^{th}$ rows R1 through R4 and $1^{st}$ through $8^{th}$ columns C1 through C8.

The number of check nodes of the error correction decoder 100 is identical to the number of rows of the parity check matrix H. $1^{st}$ through $4^{th}$ check nodes CN1 through CN4 corresponding to the $1^{st}$ through $4^{th}$ rows R1 through R4 of the parity check matrix H may be calculated by the error correction decoder 100. The number of variable nodes of the error correction decoder 100 is identical to the number of columns of the parity check matrix H. For example, $1^{st}$ through $8^{th}$ variable nodes VN1 through VN8 corresponding to $1^{st}$ through $8^{th}$ columns C1 through C8 of the parity check matrix H may be calculated by the error correction decoder 100.

Each element of the parity check matrix H is marked by "h(i,j)". "i" indicates a row of the parity check matrix H, and "j" indicates a column of the parity check matrix H. When variables of each element of the parity check matrix H are "1", the i-th check node and the j-th variable node are associated with each other. When variables of each element of the parity check matrix H are "0", the i-th check node and the j-th variable node are not associated with each other. Variable nodes VN1 through VN8 and check nodes CN1 through CN4 based on the parity check matrix H shown in FIG. 4 are illustrated in FIG. 5.

Referring to FIGS. 4 and 5, values at the second and fourth rows R2 and R4 and first column C1 corresponding to a first variable node VN1 are "1". Thus, the first variable node VN1 is associated with the second check node CN2 and the fourth check node CN4. Values at the first and second rows R1 and R2 and second column C2 corresponding to a second variable node VN2 are "1". Thus, the second variable node VN2 is associated with the first check node CN1 and the second check node CN2.

Values at the second and third rows R2 and R3 and third column C3 corresponding to a third variable node VN3 are "1". Thus, the third variable node VN3 is associated with the second check node CN2 and the third check node CN3. Values at the first and fourth rows R1 and R4 and fourth column C4 corresponding to a fourth variable node VN4 are "1". Thus, the fourth variable node VN4 is associated with the first check node CN1 and the fourth check node CN4.

Values at the first and fourth rows R1 and R4 and fifth column C5 corresponding to a fifth variable node VN5 are "1". Thus, the fifth variable node VN5 is associated with the first check node CN1 and the fourth check node CN4. Values at the second and third rows R2 and R3 and sixth column C6 corresponding to a sixth variable node VN6 are "1". Thus, the sixth variable node VN6 is associated with the second check node CN2 and the third check node CN3.

Values at the third and fourth rows R3 and R4 and seventh column C7 corresponding to a seventh variable node VN7 are "1". Thus, the seventh variable node VN7 is associated with the third check node CN3 and the fourth check node CN4. Values at the first and third rows R1 and R3 and eighth column C8 corresponding to an eighth variable node VN8 are "1". Thus, the eighth variable node VN8 is associated with the first check node CN1 and the third check node CN3.

The parity check matrix H shown in FIG. 4 and the variable nodes VN1 through VN8 and the check nodes CN1 through CN4 shown in FIG. 5 are exemplary. However, the scope and spirit of the application may not be limited thereto.

The number of variable nodes VN1 through VN8 of the error correction decoder 100 may be a basic unit of error correction decoding of the error correction decoder 100. As shown in FIGS. 4 and 5, when the number of variable nodes VN1 through VN8 is "8", the error correction decoder 100 conducts error correction decoding by a unit of eight samples. Samples of received data correspond to the variable nodes VN1 through VN8.

When the error correction decoder 100 initiates error correction decoding, the LLR generator 110 sets the variable nodes VN1 through VN8 with initial log-likelihood values LLR_I according to patterns of samples of received data.

Figure 6:
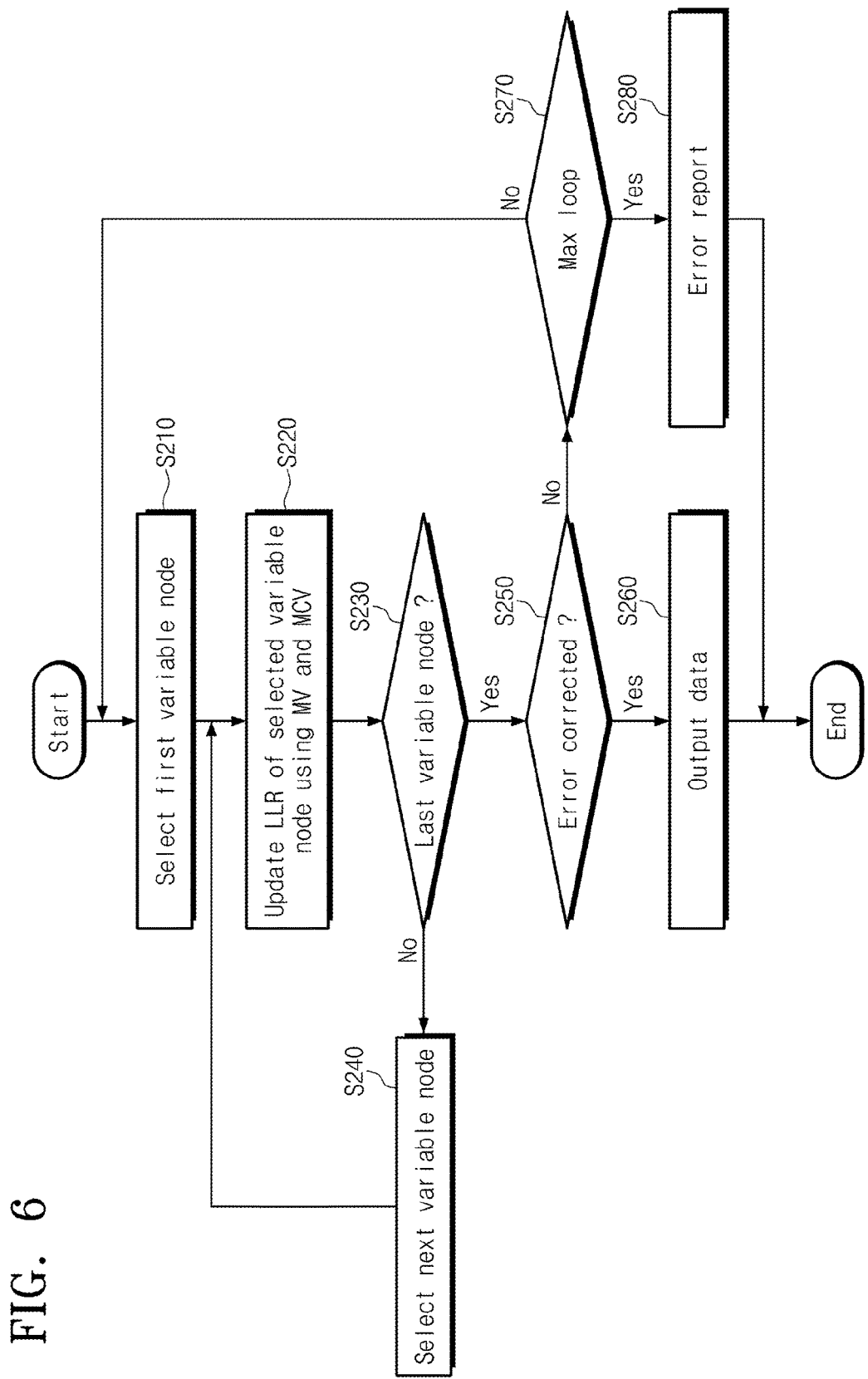
FIG. 6 is a flow chart showing a method of an error correction decoder updating a log-likelihood value of a selected variable node.

FIG. 6 is a flow chart showing a method (step S130 in FIG. 2) of error correction decoder 100 updating a log-likelihood value LLR of a selected variable node. Referring to FIGS. 1, 5, and 6, in step S210, a first variable node is selected. Selected is a first variable node VN1 of variable nodes VN1 through VN8, for example.

In step S220, an error correction decoder 100 updates a log-likelihood value LLR of the selected variable node by use of a minimum value MV and a minimum candidate value MCV In step S230, whether the selected variable node is the last variable node is determined. If not, the method proceeds to step S240, in which a next variable node is selected. Afterwards, the method proceeds to step S220. When the selected variable node is the last variable node, for example, if a log-likelihood value LLR of an eighth variable node VN8 is updated, the method proceeds to step S250.

That is, in steps S210 through S240, the variable nodes VN1 through VN8 are sequentially selected, and a log-likelihood value LLR of a selected variable node is updated. Operations of sequentially selecting the variable nodes VN1 through VN8 and updating a log-likelihood value may constitute one update loop.

If one update loop ends, in step S250, the error correction decoder 100 determines whether an error is corrected. For example, a decision unit 160 determines whether data corresponding to log-likelihood values stored at a buffer 161 has an error. If an error is corrected, in step S260, the error correction decoder 100 outputs error-corrected data DATA_C. For example, the decision unit 160 outputs data corresponding to log-likelihood values stored at the buffer 161 as the error-corrected data DATA_C. If the error is not corrected, the method proceeds to step S270.

In step S270, the error correction decoder 100 determines whether a current loop reaches a maximum loop. For example, a maximum update loop value of the error correction decoder 100 may be predetermined. The error correction decoder 100 may determine whether a value of an executed update loop reaches a maximum loop value. If a value of an executed update loop does not reach the maximum loop value, the method may proceed to step S210. If a value of an executed update loop reaches the maximum loop value, in step S280, the error correction decoder 100 provides notification that an error of the received data is uncorrectable.

That is, the error correction decoder 100 iterates the update loop until a current loop reaches a maximum loop. In each update loop, the error correction decoder 100 sequentially updates a log-likelihood value LLR of each variable node.

Figure 7:
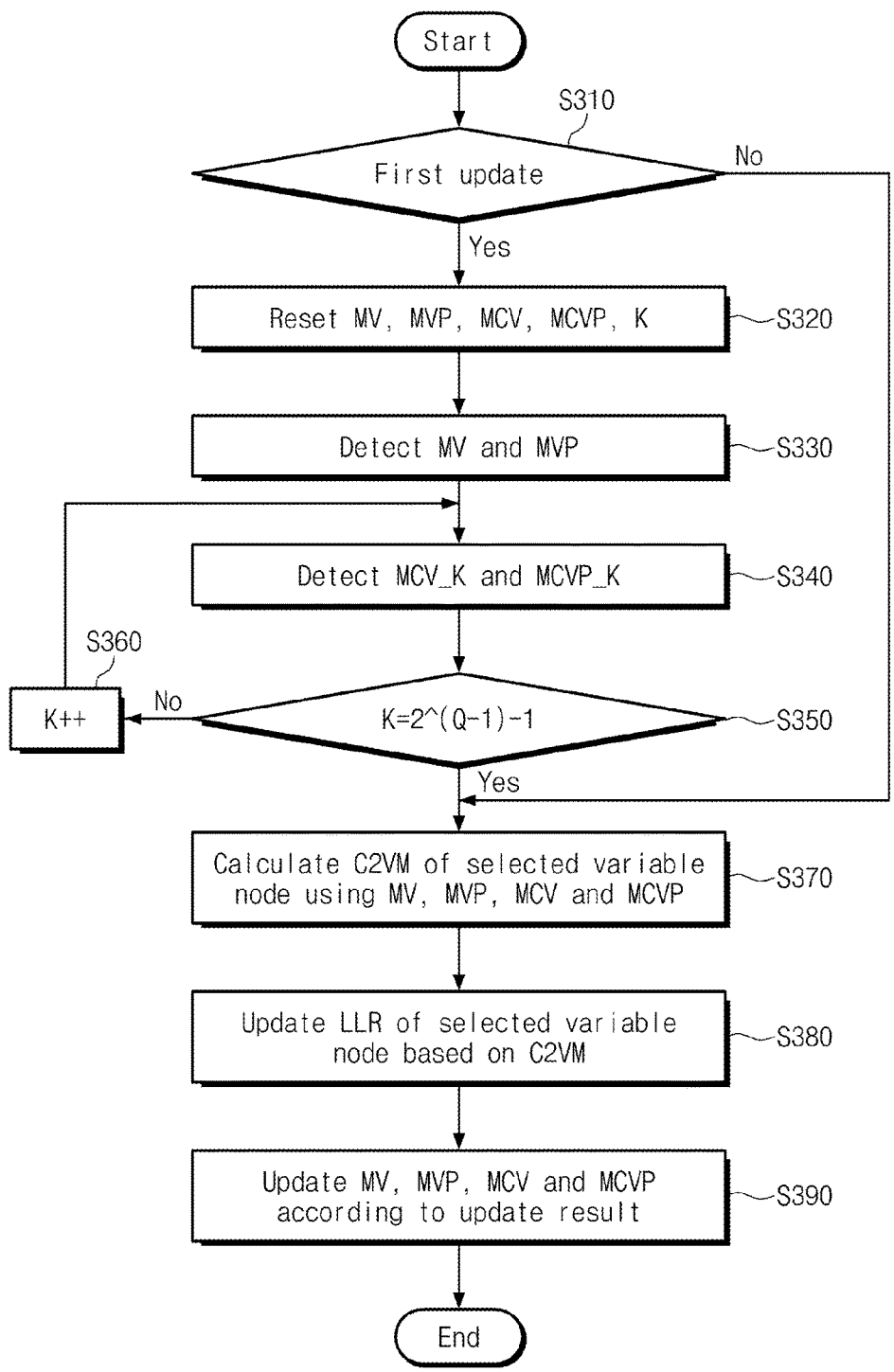
FIG. 7 is a flow chart showing a method of updating a log-likelihood value of a selected variable node.

FIG. 7 is a flow chart showing a method (step S220 in FIG. 6) of updating a log-likelihood value LLR of a selected variable node. Referring to FIGS. 1, 5, and 7, in step S310 a determination is made of whether the update is the first to occur. For example, there is determined whether updating of a selected variable node is a first update of a selected node sharing a check node. For example, it is determined whether the selected variable node is being initially updated by a check node connected with the selected variable node. For example, there is determined whether a minimum value MV, a minimum value position MVP, a minimum candidate value MCV, and a minimum candidate value position MCVP exist at check nodes associated with the selected variable node.

That the updating of the selected variable node is not first updating means that a minimum value MV, a minimum value position MVP, a minimum candidate value MCV, and a minimum candidate value position MCVP previously exist at check nodes associated with the selected variable node. Thus, step S370 is directly performed.

That the updating of the selected variable node is first updating means that a minimum value MV, a minimum value position MVP, a minimum candidate value MCV, and a minimum candidate value position MCVP do not exist at check nodes associated with the selected variable node. Thus, step S320 is executed to detect a minimum value MV, a minimum value position MVP, a minimum candidate value MCV, and a minimum candidate value position MCVP.

In step S320, a minimum value MV, a minimum value position MVP, a minimum candidate value MCV, a minimum candidate value position MCVP, and a variable K are reset. For example, a minimum value MV, a minimum value position MVP, a minimum candidate value MCV, and a minimum candidate value position MCVP are reset with maximum values, and the variable K is reset with "1".

In step S330, a check node updater 130 detects the minimum value MV and the minimum value position MVP. For example, the check node updater 130 may detect the minimum value MV and the minimum value position MVP corresponding to a check node connected with the selected variable node. For example, the check node updater 130 receives initial log-likelihood values LLR_I of the sharing variable nodes from a first message calculator 120. The check node updater 130 identifies the smallest absolute value of the initial log-likelihood values LLR_I of the sharing variable nodes as the minimum value MV. The check node updater 130 detects a position of the last variable node, having the minimum value MV, from among the sharing variable nodes, for example, a position of the most recently updated variable node (or a position of a variable node to be updated last) as the minimum value position MVP.

In step S340, the check node updater 130 detects a K-th minimum candidate value MCV_K and a K-th minimum candidate value position MCVP_K. For example, the check node updater 130 detects the K-th minimum candidate value MCV_K and the K-th minimum candidate value position MCVP_K corresponding to a check node connected with the selected variable node.

For example, the check node updater 130 detects a value, greater than the minimum value MV (e.g., when the variable K is "1") or the K-$1^{st}$ minimum candidate value MCV_K-1 (e.g., when the variable K is more than "2") and smallest, from among absolute values of log-likelihood values of variable nodes and updated later than a variable node of the sharing variable nodes corresponding to the minimum value position MVP, as the K-th minimum candidate value MCV_K.

For example, the check node updater 130 detects a position of the last variable node, having the K-th minimum candidate value MCV_K and updated later than a variable node of the sharing variable nodes corresponding to the minimum value position MVP, as the K-th minimum candidate value position MCVP_K.

In steps S340, S350, and S360, the K-th minimum candidate value MCV_K and the K-th minimum candidate value position MCVP_K are detected until the variable K reaches "$2^{(Q-1)}-1$".

The variable Q indicates the number of bits of a sample of the received data. One of bits of the sample is used to identify a sign. Thus, "$2^{(Q-1)}-1$" indicates the number of types of absolute values of log-likelihood values that the sample can have. That is, in steps S310 through S360, the check node updater 130 sequentially detects the minimum value MV and the minimum candidate value MCV of absolute values of log-likelihood values of variable nodes VN1 through VN8 according to the following orders: an order from a small value to a great value and an order from an earlier updated variable node to a later updated variable node. At this time, the minimum value MV and the minimum candidate value MCV have different values.

As shown in FIG. 4, when "Q" is 3, the check node updater 130 detects a minimum value MV, a minimum position MVP, first through third minimum candidate values MCV_1 through MCV_3, and first through third minimum candidate value positions MCVP_1 through MCVP_3.

Steps S320 through S360 are executed in common at check nodes, at which first updating is performed, from among check nodes associated with a selected variable node.

In steps S310 through S360, if a minimum value MV, a minimum value position MVP, a minimum candidate value MCV, and a minimum candidate value position MCVP are detected or if updating of a selected variable node is not first updating, step S370 is executed.

In step S370, a second message C2VM to the selected variable node is calculated using the minimum value MV, minimum value position MVP, minimum candidate value MCV, and minimum candidate value position MCVP.

In step S380, a log-likelihood value LLR of the selected variable node is updated using the second message C2VM thus calculated.

In step S390, the minimum value MV, minimum value position MVP, minimum candidate value MCV, and minimum candidate value position MCVP of check nodes associated with the selected variable node are updated according to an updating result of the selected variable node.

Figure 8:
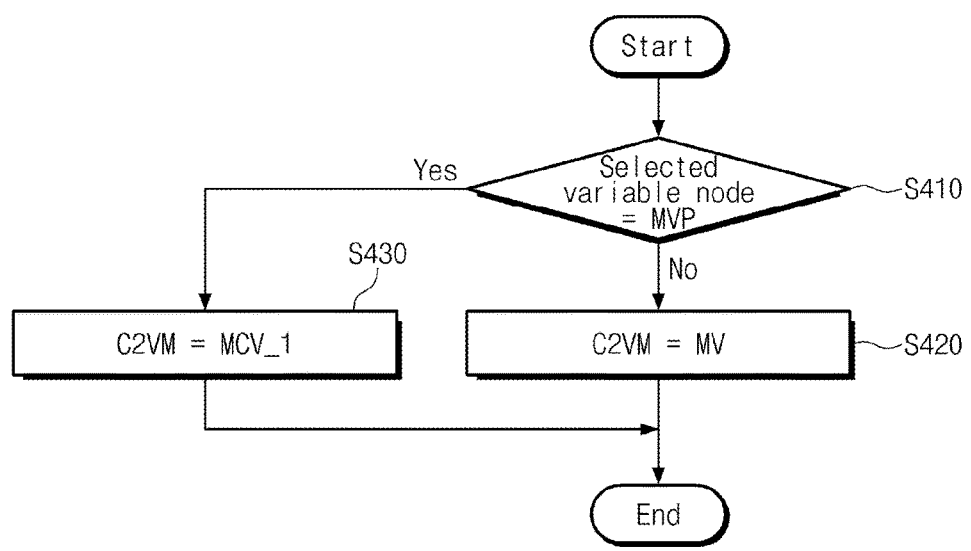
FIG. 8 is a flow chart showing a method of calculating a second message to a selected variable node.

FIG. 8 is a flow chart showing a method (S370) of calculating a second message C2VM to a selected variable node. Referring to FIGS. 1 and 8, in step S410, whether a position of a selected variable node corresponds to a minimum value position MVP is determined. For example, at each of the check nodes connected with the selected variable node, the position of the selected variable node is compared with the minimum value position MVP.

When the position of the selected variable node is different from the minimum value position MVP, a second message C2VM to be transmitted from a check node, having a corresponding minimum value position MVP, to the selected variable node may be a minimum value MV (step S420).

When the position of the selected variable node is the same as the minimum value position MVP, a second message C2VM to be transmitted from a check node, having a minimum value position MVP, to the selected variable node may be a first minimum candidate value MCV_1. The first minimum candidate value MCV_1 may be a value, greater than the minimum value MV and smallest, from among absolute values of log-likelihood values of sharing variable nodes (step S430).

Figure 9:
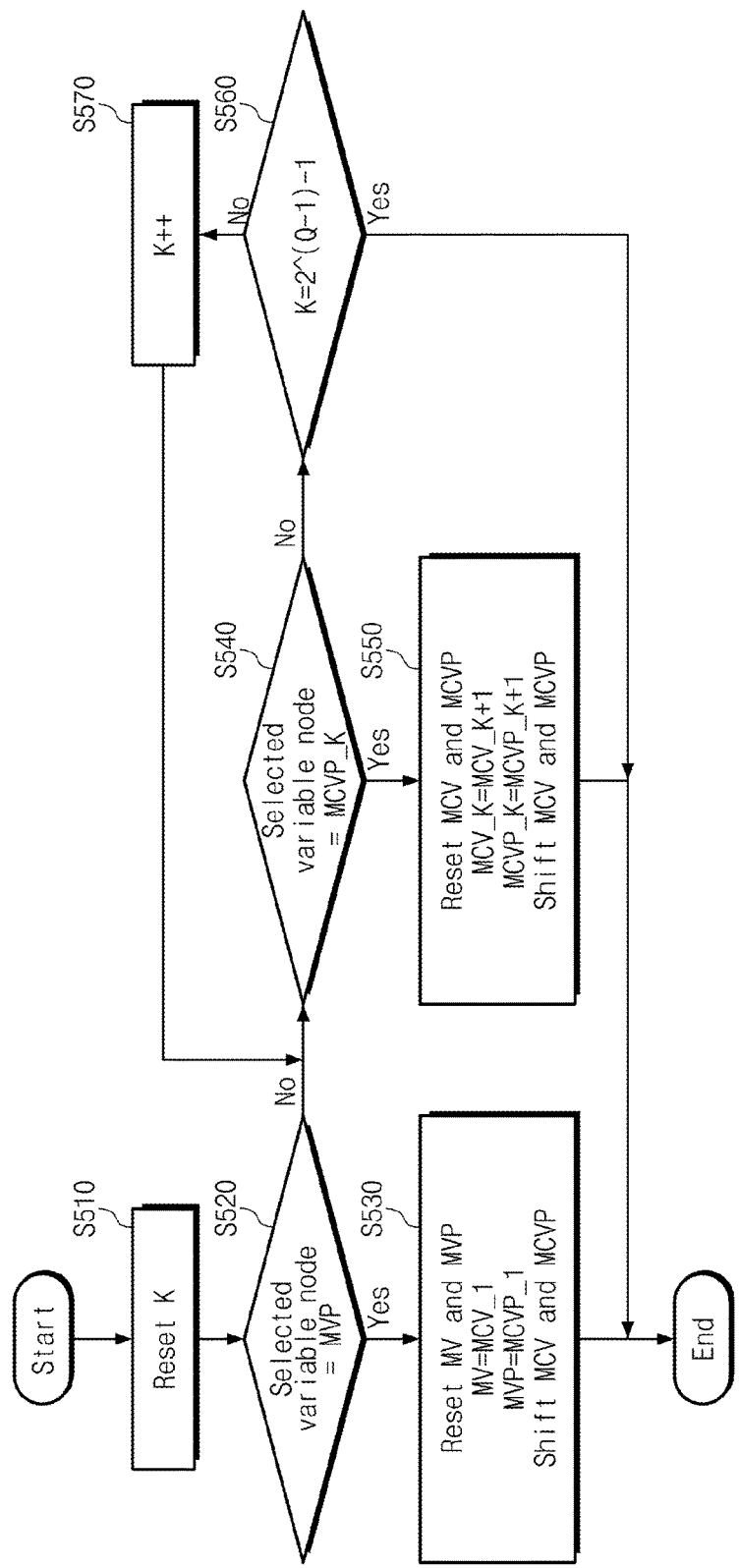
FIG. 9 is a flow chart showing a first embodiment where a minimum value, a minimum value position, a minimum candidate value, and a minimum candidate value position are updated.

FIG. 9 is a flow chart showing a first embodiment where a minimum value MV, a minimum value position MVP, a minimum candidate value MCV, a minimum candidate value position MCVP are updated. Referring to FIGS. 1 and 9, in step S510, the variable K is reset.

In step S520, there is determined whether a position of a selected variable node is the same as a minimum value position MVP. If so, at step S530, a minimum value MV and a minimum value position MVP are reset. The minimum value MV is set to have a value of a first minimum candidate value MCV_1, and the minimum value position MVP is set to have a first minimum candidate value position MCVP_1. Remaining minimum candidate values MCV and minimum candidate value positions MCVP, that is, minimum candidate values MCV, having a value greater than the minimum value MV, and minimum candidate value positions MCVP associated therewith are shifted as much as one grade. For example, a second minimum candidate value MCV_2 and a second minimum candidate value position MCVP_2 are shifted into a first minimum candidate value MCV_1 and a first minimum candidate value position MCVP_1. An n-th minimum candidate value MCV_n and an n-th minimum candidate value position MCVP_n are shifted into an n−$1^{st}$ minimum candidate value MCV_n−1 and an n−$1^{st}$ minimum candidate value position MCVP_n−1.

When a position of the selected variable node is not the minimum value position MVP, the method proceeds to step S540, in which a determination is made whether a position of the selected variable node corresponds to a K-th minimum candidate value position MCVP_K. When a position of the selected variable node corresponds to the K-th minimum candidate value position MCVP_K, in step S550, a K-th minimum candidate value MCV_K and a K-th minimum candidate value position MCVP_K are reset. The K-th minimum candidate value MCV_K and the K-th minimum candidate value position MCVP_K are set to have a K+$1^{st}$ minimum candidate value MCV_K+1 and a K+$1^{st}$ minimum candidate value position MCVP_K+1. Minimum candidate values MCV following the K+$1^{st}$ minimum candidate value MCV_K+1 and minimum candidate value positions MCVP following the K+$1^{st}$ minimum candidate value position MCVP_K+1, that is, minimum candidate values MCV, having a value greater than the K-th minimum candidate value MCV_K, and minimum candidate value positions MCVP associated therewith are shifted as much as one grade. For example, an n+$1^{st}$ minimum candidate value MCV_n+1 and an n+$1^{st}$ minimum candidate value position MCVP_n+1 are shifted into an n-th minimum candidate value MCV_n and an n-th minimum candidate value position MCVP_n.

When a position of the selected variable node is not the K-th minimum candidate value position MCVP_K, in step S560, whether the variable K reaches "$2^{(Q-1)}-1$" is determined. For example, whether all minimum candidate value positions MCVP are compared is determined. As a consequence of determining that all minimum candidate value positions MCVP are not compared, the method proceeds to step S570, in which the variable K increases. Afterwards, the method proceeds to step S540.

In exemplary embodiments, a check node updater 130 may manage a log-likelihood value LLR of a selected variable node with a minimum value MV or a minimum candidate value MCV. When updated in step S380, a log-likelihood value LLR of a selected variable node is not valid any longer. Thus, when a log-likelihood value LLR of a selected variable node is managed with a minimum value MV or a minimum candidate value MCV, for example, when a position of the selected variable node corresponds to a minimum value position MVP or a minimum candidate value position MCVP, the check node updater 130 deletes a minimum value MV or a minimum candidate value MCV together with associated minimum value position MVP or minimum candidate value position MCVP from a memory 140. Afterwards, to maintain continuity of the minimum value MV and the minimum candidate value MCV, the check node updater 130 shifts a minimum candidate value MCV following the deleted minimum value MV or minimum candidate value MCV together with an associated minimum candidate value position MCVP as much as one step.

Figure 10:
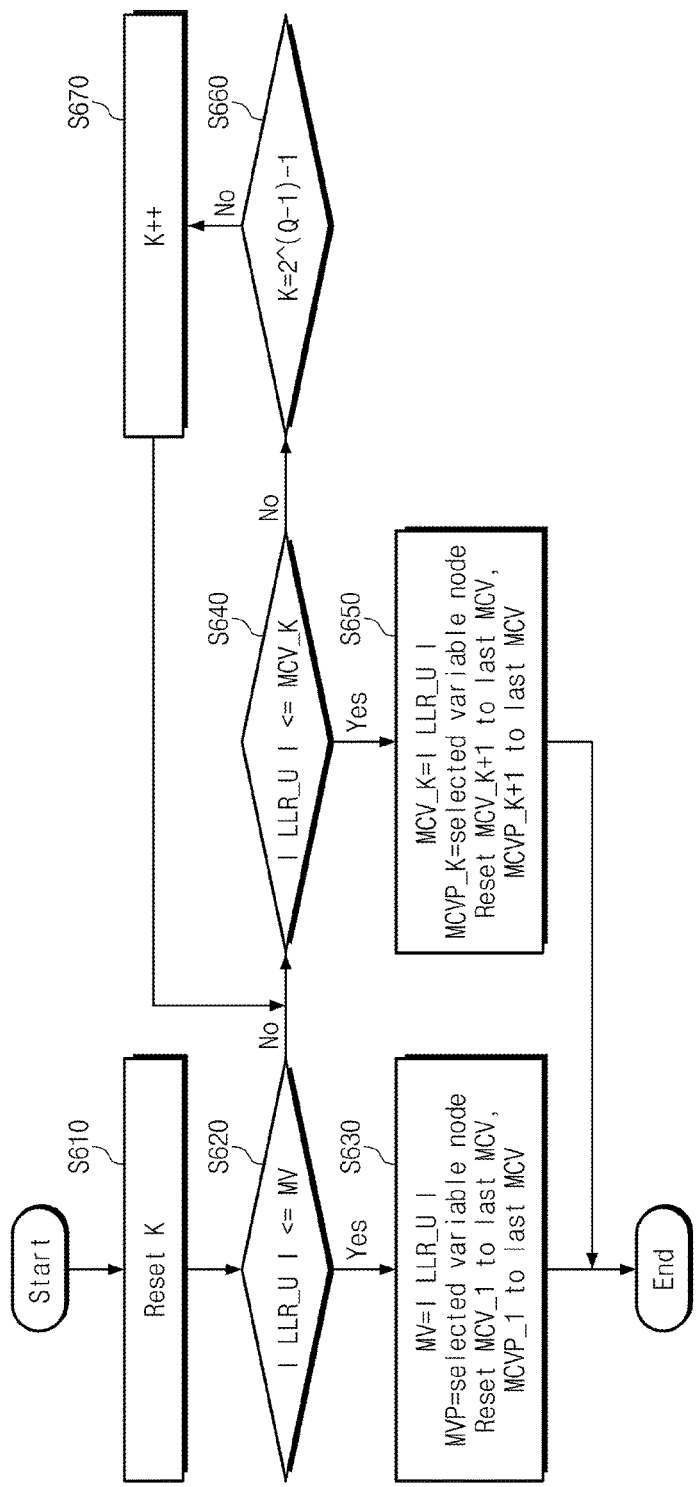
FIG. 10 is a flow chart showing a second embodiment where a minimum value, a minimum value position, a minimum candidate value, and a minimum candidate value position are updated.

FIG. 10 is a flow chart showing a second embodiment where a minimum value MV, a minimum value position MVP, a minimum candidate value MCV, a minimum candidate value position MCVP are updated. Referring to FIGS. 1 and 10, in step S610, the variable K is reset.

In step S620, whether an absolute value of an updated log-likelihood value LLR_U of a selected variable node is smaller than or equal to a minimum value MV is determined. When the absolute value of the updated log-likelihood value LLR_U of the selected variable node is smaller than or equal to the minimum value MV, in step S630, the minimum value MV is set with the absolute value of the updated log-likelihood value LLR_U. A minimum value position MVP is set with a position of the selected variable node. Afterwards, minimum candidate values MCV, having a value greater than the minimum value MV, and minimum candidate value positions MCVP associated therewith are reset.

When the absolute value of the updated log-likelihood value LLR_U is greater than the minimum value MV, in step S640, there is determined whether the absolute value of the updated log-likelihood value LLR_U is smaller than or equal to a K-th minimum candidate value MCV_K. When the absolute value of the updated log-likelihood value LLR_U is smaller than or equal to the K-th minimum candidate value MCV_K, in step S650, the K-th minimum candidate value MCV_K is set with the absolute value of the updated log-likelihood value LLR_U, and the K-th minimum candidate value position MCVP_K is set with a position of the selected variable node. Afterwards, minimum candidate values MCV, having a value greater than the K-th minimum candidate value MCV_K, and minimum candidate value positions MCVP are reset.

When the absolute value of the updated log-likelihood value LLR_U is greater than the K-th minimum candidate value MCV_K, in step S660, whether the variable K reaches "$2^{(Q-1)}-1$". That is, the absolute value of the updated log-likelihood value LLR_U is compared with all minimum candidate values MCV. When all minimum candidate values MCV are not compared, the method proceeds to step S670, in which the variable K increases. Afterwards, the method proceeds to step S640.

In exemplary embodiments, when updated, a log-likelihood value LLR of a selected variable node is again updated after other sharing variable nodes are respectively updated. That is, at a point in time when a log-likelihood value LLR of a selected variable node is updated, an updated log-likelihood value LLR_U of the selected variable node may be a log-likelihood value, most recently updated (or being updated last), from among log-likelihood values of sharing variable nodes. A check node update 130 manages an absolute value of a log-likelihood value, most recently updated (or being updated last), from among log-likelihood values having the same absolute value with a minimum value MV or a minimum candidate value MCV. Now that the updated log-likelihood value LLR_U of the selected variable node is the most recently updated log-likelihood value (or updated last), the check node updater 130 updates the minimum value MV or the minimum candidate value MCV depending on whether the updated log-likelihood value LLR_U is smaller than the minimum value MV or the minimum candidate value MCV.

When registered as the minimum value MV or the minimum candidate value MCV, an absolute value of the updated log-likelihood value LLR_U is maintained with a minimum value or a minimum candidate value MCV during at least one loop. Thus, a minimum candidate value MCV greater than the absolute value of the updated log-likelihood value LLR_U is not used. Now that a minimum candidate value MCV greater than the absolute value of the updated log-likelihood value LLR_U is not used, the check node updater 130 resets a minimum candidate value MCV, having a value greater than a minimum value MV or a minimum candidate value MCV updated by the updated log-likelihood value LLR_U, and a minimum candidate value position MCVP associated therewith.

As described with reference to FIGS. 6 through 10, an error correction decoder 100 performs a plurality of update loops depending on variable nodes VN1 through VN8 and check nodes CN1 through CN8. In each update loop, the error correction decoder 100 sequentially selects the variable nodes VN1 through VN8, updates a log-likelihood value LLR of a selected variable node by use of a minimum value MV, a minimum value position MVP, a minimum candidate value MCV, and a minimum candidate value position MCVP, and updates the minimum value MV, the minimum value position MVP, the minimum candidate value MCV, and the minimum candidate value position MCVP according to the updating result.

Figure 11:
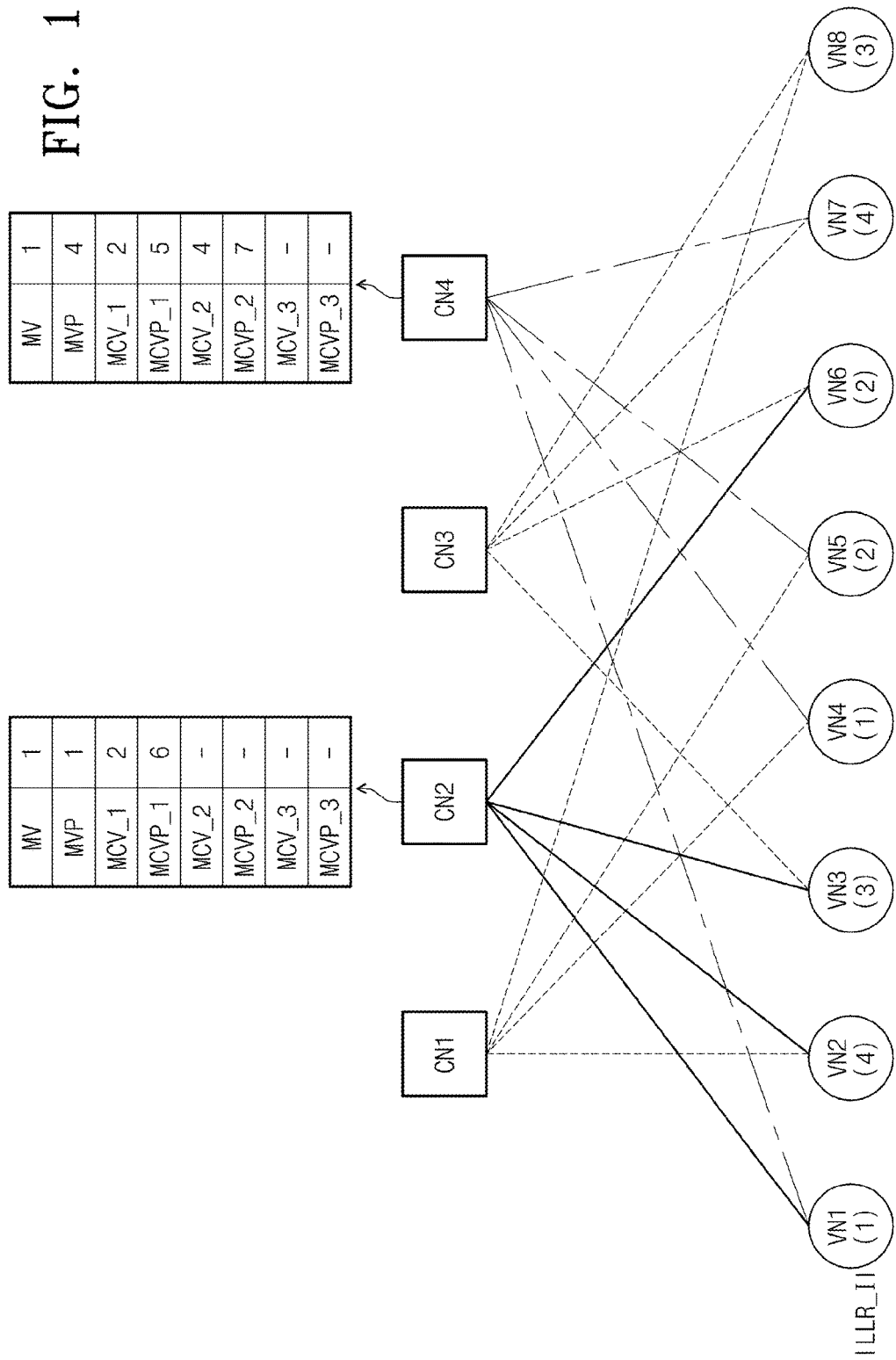
FIGS. 11 through 22 show a procedure where an error correction decoder conducts error correction decoding based on the variable nodes and check nodes shown in FIG. 5.

FIGS. 11 through 22 show a procedure where an error correction decoder 100 conducts error correction decoding based on variable nodes VN1 through VN8 and check nodes CN1 through CN4 shown in FIG. 5. Referring to FIGS. 1 and 11, first through eighth variable nodes VN1 through VN8 are set with initial log-likelihood values LLR_I of "1", "4", "3", "1", "2", "2", "4", and "3". In exemplary embodiments, the first through eighth variable nodes VN1 through VN8 may be sequentially updated in order from the first variable node to the eighth variable node.

The first variable node VN1 is selected for the error correction decoding. The first variable node VN1 is connected with a second check node CN2 and a fourth check node CN4. Sharing variable nodes of a first variable node VN1 associated with the second check node CN2 are the first variable node VN1, a second variable node VN2, a third variable node VN3, and a sixth variable node VN6. Sharing variable nodes of the first variable node VN1 associated with the fourth check node CN4 are the first variable node VN1, a fourth variable node VN4, a fifth variable node VN5, and a seventh variable node VN7.

A second message C2VM from the second check node CN2 and a second message C2VM from the fourth check node CN4 are necessary to update a log-likelihood value LLR of the first variable node VN1. Thus, the second messages C2VM from the second check node CN2 and the fourth check node CN4 are calculated.

Updating of a variable node is first performed at the sharing variable nodes VN1, VN2, VN3, and VN6 of the second check node CN2. A check node updater 130 detects a minimum value MV, a minimum value position MVP, a minimum candidate value MCV, and a minimum candidate value position MCVP from the initial log-likelihood values LLR_I of the sharing variable nodes VN1, VN2, VN3, and VN6.

In exemplary embodiments, a method of detecting a minimum value MV, a minimum value position MVP, a minimum candidate value MCV, and a minimum candidate value position MCVP depending on the initial log-likelihood values LLR_I is substantially the same as a method described with reference to FIG. 10 except that an absolute value of an updated log-likelihood value LLR_U is replaced with an absolute value of an initial log-likelihood value LLR_I.

Selected is the first variable node VN1 of the sharing variable nodes VN1, VN2, VN3, and VN6 of the second check node CN2, for example. Now that an initial log-likelihood value LLR_I of the first variable node VN1 is "1", in step S630, a minimum value MV and a minimum value position MVP are respectively set with "1".

Selected is the second variable node VN2 of the sharing variable nodes VN1, VN2, VN3, and VN6. Now that an initial log-likelihood value LLR_I of the second variable node VN2 is "4", in step S650, the minimum value MV and the minimum value position MVP maintain "1", respectively, and a first minimum candidate value MCV_1 and a first minimum candidate value position MCVP_1 are set with "4" and "2".

The third variable node VN3 of the sharing variable nodes VN1, VN2, VN3, and VN6 is selected. Since an initial log-likelihood value LLR_I of the third variable node VN3 is "3", in step S650, the minimum value MV and the minimum value position MVP maintain "1", respectively, and the first minimum candidate value MCV_1 and the first minimum candidate value position MCVP_1 are updated with "3" and "3".

Selected is the sixth variable node VN6 of the sharing variable nodes VN1, VN2, VN3, and VN6. Now that an initial log-likelihood value LLR_I of the sixth variable node VN6 is "2", in step S650, the minimum value MV and the minimum value position MVP maintain "1", respectively, and the first minimum candidate value MCV_1 and the first minimum candidate value position MCVP_1 are set with "2" and "6".

Accordingly, as illustrated in FIG. 11, at the second check node CN2, the minimum value MV is detected to be "1", the minimum value position MVP to be "1", the first minimum candidate value MCV_1 to be "2", and the first minimum candidate value position MCVP_1 to be "6".

Updating of a variable node is first performed at the sharing variable nodes VN1, VN4, VN5, and VN7 of the fourth check node CN4. The check node updater 130 detects a minimum value MV, a minimum value position MVP, a minimum candidate value MCV, and a minimum candidate value position MCVP from the initial log-likelihood values LLR_I of the sharing variable nodes VN1, VN4, VN5, and VN7.

In exemplary embodiments, a method of detecting a minimum value MV, a minimum value position MVP, a minimum candidate value MCV, and a minimum candidate value position MCVP depending on the initial log-likelihood values LLR_I is substantially the same as a method described with reference to FIG. 10 except that an absolute value of an updated log-likelihood value LLR_U is replaced with an absolute value of an initial log-likelihood value LLR_I.

As illustrated in FIG. 11, at the fourth check node CN4, the minimum value MV is detected to be "1", the minimum value position MVP to be "4", a first minimum candidate value MCV_1 to be "2", and a first minimum candidate value position MCVP_1 to be "5". Furthermore, a second minimum candidate value MCV_2 is detected to be "4" and a second minimum candidate value position MCVP_2 to be "7".

After the minimum values MV, minimum value positions MVP, minimum candidate values MCV, and minimum candidate value positions MCVP of the second and fourth check nodes CN2 and CN4 connected with the first variable node VN1 selected are calculated, second messages C2VM to be transferred from the second and fourth check nodes CN2 and CN4 to the first variable node VN1 are calculated. Below, an embodiment of the application is exemplified as the second message C2VM from the second check node CN2 is calculated and then the second message C2VM from the fourth check node CN4 is calculated. However, the scope and spirit of the application may not be limited thereto. For example, the second messages C2VM from the second and fourth check nodes CN2 and CN4 may be calculated sequentially or simultaneously.

Figure 12:
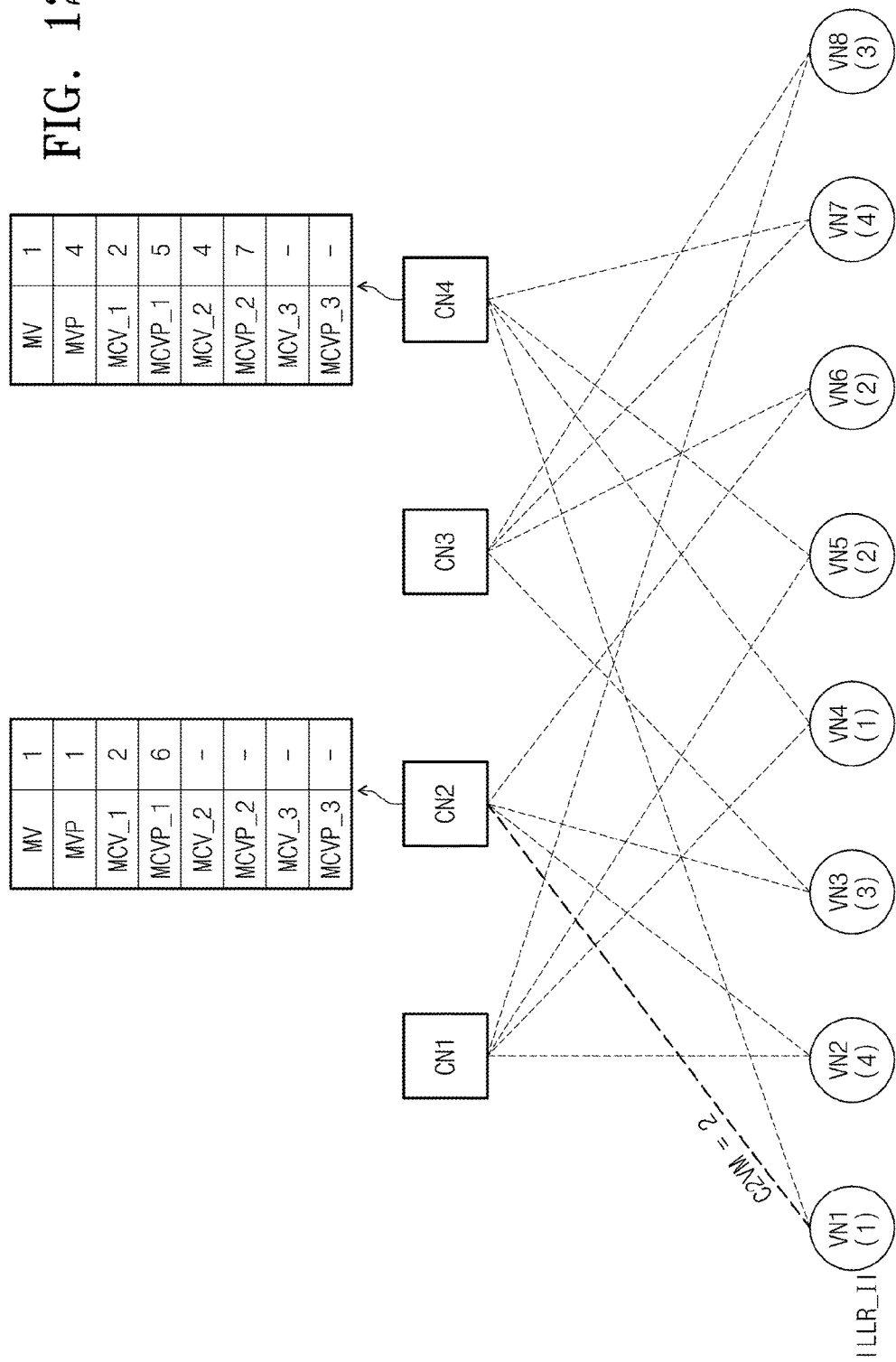

Referring to FIG. 12, a position of the first variable node VN1 selected is identical to the minimum value position MVP of the second check node CN2. Thus, as described with reference to step S430 shown in FIG. 8, a second message calculator 150 outputs the first minimum candidate value MCV_1 of "2" as the second message C2VM from the second check node CN2.

As described with reference to step S530 shown in FIG. 9, the minimum value MV and the minimum value position MVP of the second check node CN2 are reset because a position of the first variable node VN1 selected is identical to the minimum value position MVP of the second check node CN2.

The minimum value MV of the second check node CN2 is set to have the first minimum candidate value MCV_1. The minimum value position MVP of the second check node CN2 is set to have the first minimum candidate value position MCVP_1. Remaining minimum candidate values MCV_2 and MCV_3 and remaining minimum candidate value positions MCVP_2 and MCVP_3 of the second check node CN2 are shifted as much as one grade. Updated results of the minimum value MV, minimum value position MVP, minimum candidate value MCV, and minimum candidate value position MCVP of the second check node CN2 are illustrated in FIG. 13.

Figure 13:
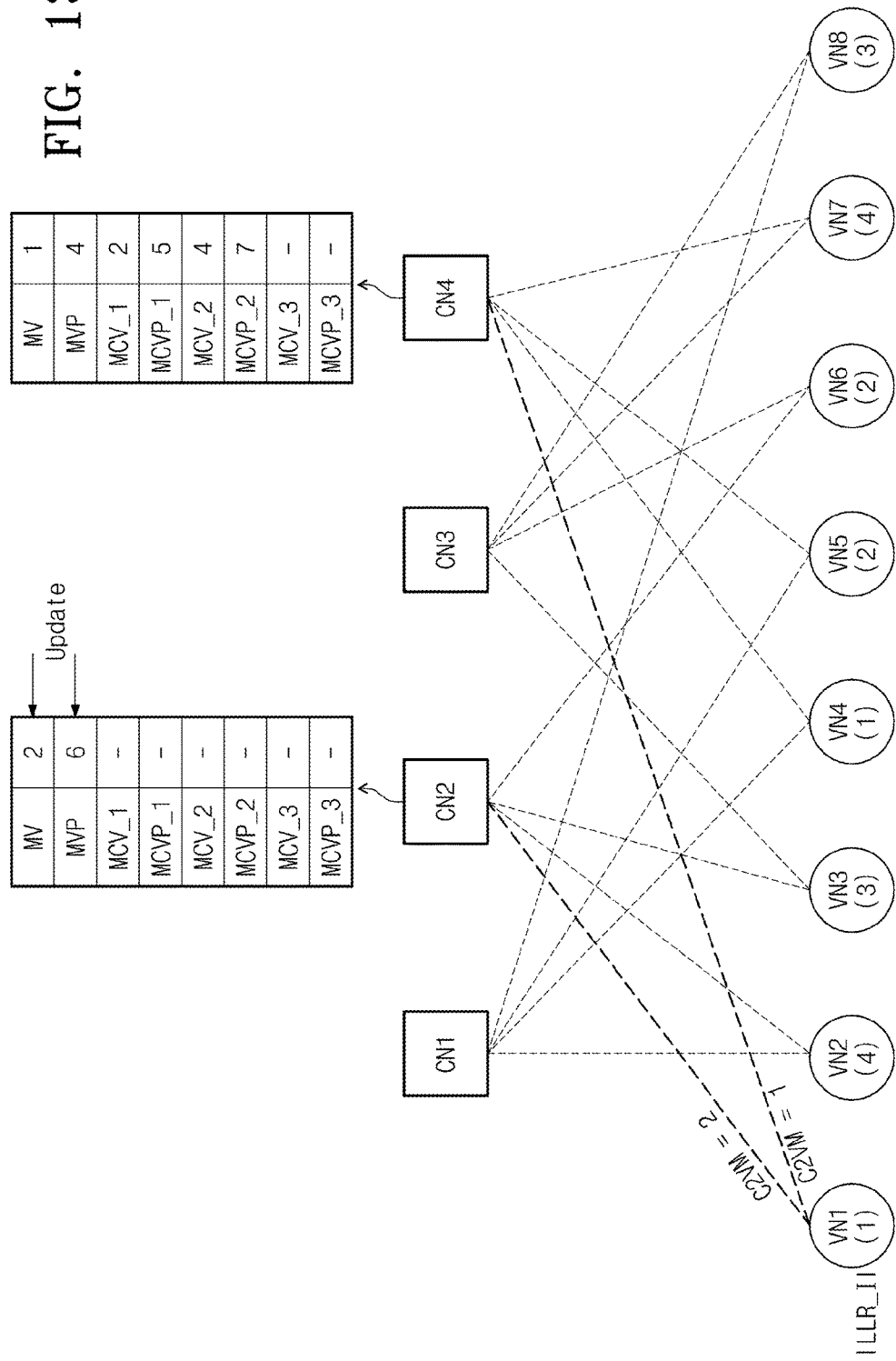

Referring to FIG. 13, a position of the first variable node VN1 selected is different from the minimum value position MVP of the fourth check node CN4. Thus, as described with reference to step S420 shown in FIG. 8, the second message calculator 150 outputs the minimum value MV of "1" as the second message C2VM from the fourth check node CN4.

The check node updater 130 does not perform updating about the fourth check node (described with reference to FIG. 9) because a position of the first variable node VN1 selected is different from the minimum value position MVP and the minimum candidate value position MCVP of the fourth check node CN4.

Figure 14:
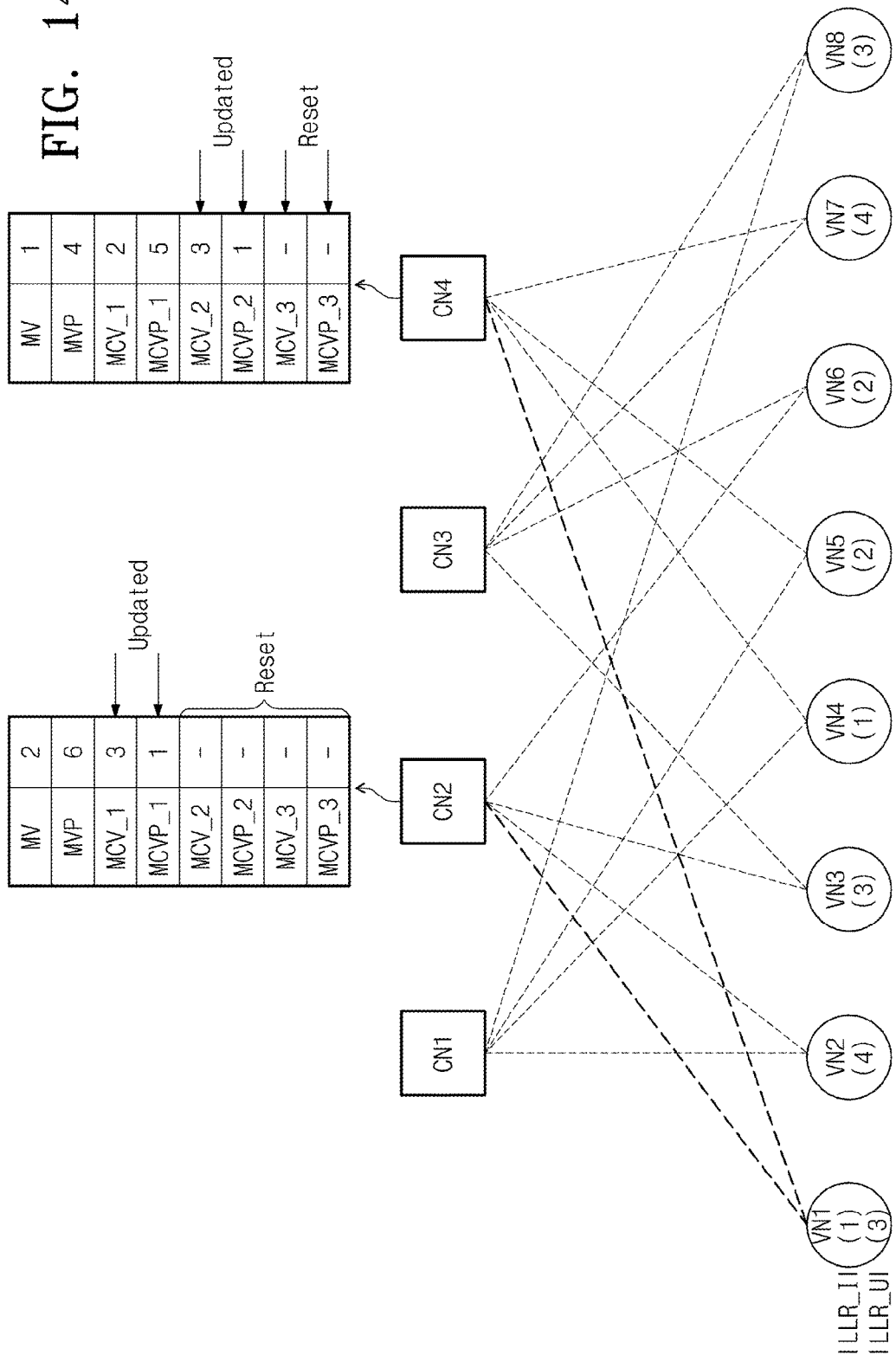

Referring to FIG. 14, a first message calculator 120 adds an initial log-likelihood value LLR_I of the first variable node VN1 selected, the second message C2VM from the second check node CN2, and the second message C2VM from the fourth check node CN4 to calculate an updated log-likelihood value LLR_U of the first variable node VN1 selected. Signs SIGN of log-likelihood values stored at a memory 140 are used upon calculating of the updated log-likelihood value LLR_U. For example, it is assumed that an absolute value of an updated log-likelihood value LLR_U of the first variable node VN1 is "3". The updated log-likelihood value LLR_U of the first variable node VN1 or the absolute value of the updated log-likelihood value LLR_U is stored at a buffer 161 of a decision unit 160. A sign SIGN of a log-likelihood value LLR of the first variable node VN1 stored at the memory 140 is updated when a sign of the updated log-likelihood value LLR_U of the first variable node VN1 is different from a sign of a log-likelihood value before updating, for example, a sign of the initial log-likelihood value LLR_I.

At the second check node CN2, the absolute value of the updated log-likelihood value LLR_U is greater than the minimum value MV, while the first minimum candidate value MCV_1 does not exist. As described with reference to the case that the variable K is "1" (refer to step S650 shown in FIG. 10), the first minimum candidate value MCV_1 is updated with the absolute value of the updated log-likelihood value LLR_U. The first minimum candidate value position MCVP_1 is updated with a position of the first variable node VN1 selected. Reset are second and third minimum candidate values MCV_2 and MCV_3, set to have a value greater than the first minimum candidate value MCV_1, and second and third minimum candidate value positions MCVP_2 and MCVP_3.

At the fourth check node CN4, the absolute value of the updated log-likelihood value LLR_U is greater than the first minimum candidate value MCV_1 and smaller than the second minimum candidate value MCV_2. As described with reference to the case that the variable K is "2" (refer to step S650 shown in FIG. 10), the second minimum candidate value MCV_2 is updated with the absolute value of the updated log-likelihood value LLR_U. The second minimum candidate value position MCVP_2 is updated with a position of the first variable node VN1 selected. Reset are the third minimum candidate value MCV_3, set to have a value greater than the second minimum candidate value MCV_2, and the third minimum candidate value position MCVP_3 associated therewith.

Figure 15:
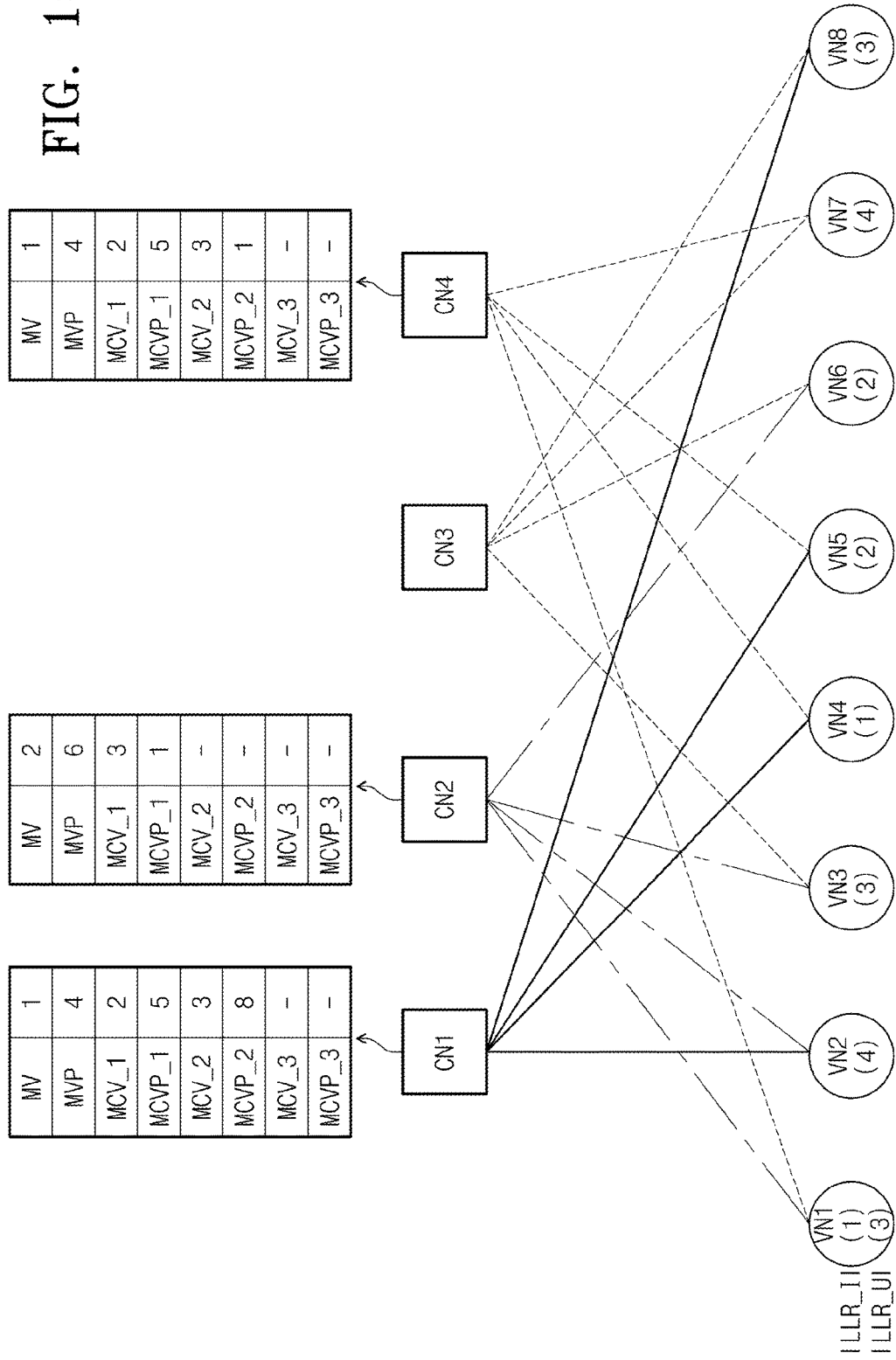

Referring to FIG. 15, the second variable node VN2 is selected for the error correction decoding. The second variable node VN2 is connected with a first check node CN1 and a second check node CN2. Sharing variable nodes of a second variable node VN2 associated with the first check node CN1 are a second variable node VN2, a fourth variable node VN4, a fifth variable node VN5, and an eighth variable node VN8. Sharing variable nodes of the second variable node VN2 associated with the second check node CN2 are the first variable node VN1, the second variable node VN2, a third variable node VN3, and a sixth variable node VN6.

A second message C2VM from the first check node CN1 and a second message C2VM from the second check node CN2 are necessary to update a log-likelihood value LLR of the second variable node CN2. Thus, the second messages C2VM from the first check node CN1 and the second check node CN2 are calculated.

Updating of a variable node is first performed at the sharing variable nodes VN2, VN4, VN5, and VN8 of the first check node CN1. The check node updater 130 detects a minimum value MV, a minimum value position MVP, a minimum candidate value MCV, and a minimum candidate value position MCVP from the initial log-likelihood values LLR_I of the sharing variable nodes VN2, VN4, VN5, and VN8.

In exemplary embodiments, a method of detecting a minimum value MV, a minimum value position MVP, a minimum candidate value MCV, and a minimum candidate value position MCVP depending on the initial log-likelihood values LLR_I is substantially the same as a method described with reference to FIG. 10 except that an absolute value of an updated log-likelihood value LLR_U is replaced with an absolute value of an initial log-likelihood value LLR_I.

As illustrated in FIG. 15, at the first check node CN1, the minimum value MV is detected to be "1", the minimum value position MVP to be "4", a first minimum candidate value MCV_1 to be "2", and a first minimum candidate value position MCVP_1 to be "5". Furthermore, a second minimum candidate value MCV_2 is detected to be "3" and a second minimum candidate value position MCVP_2 to be "8".

Previously existing, the minimum values MV, minimum value positions MVP, minimum candidate values MCV, and minimum candidate value positions MCVP of the second check node CN2 are not separately calculated.

Figure 16:
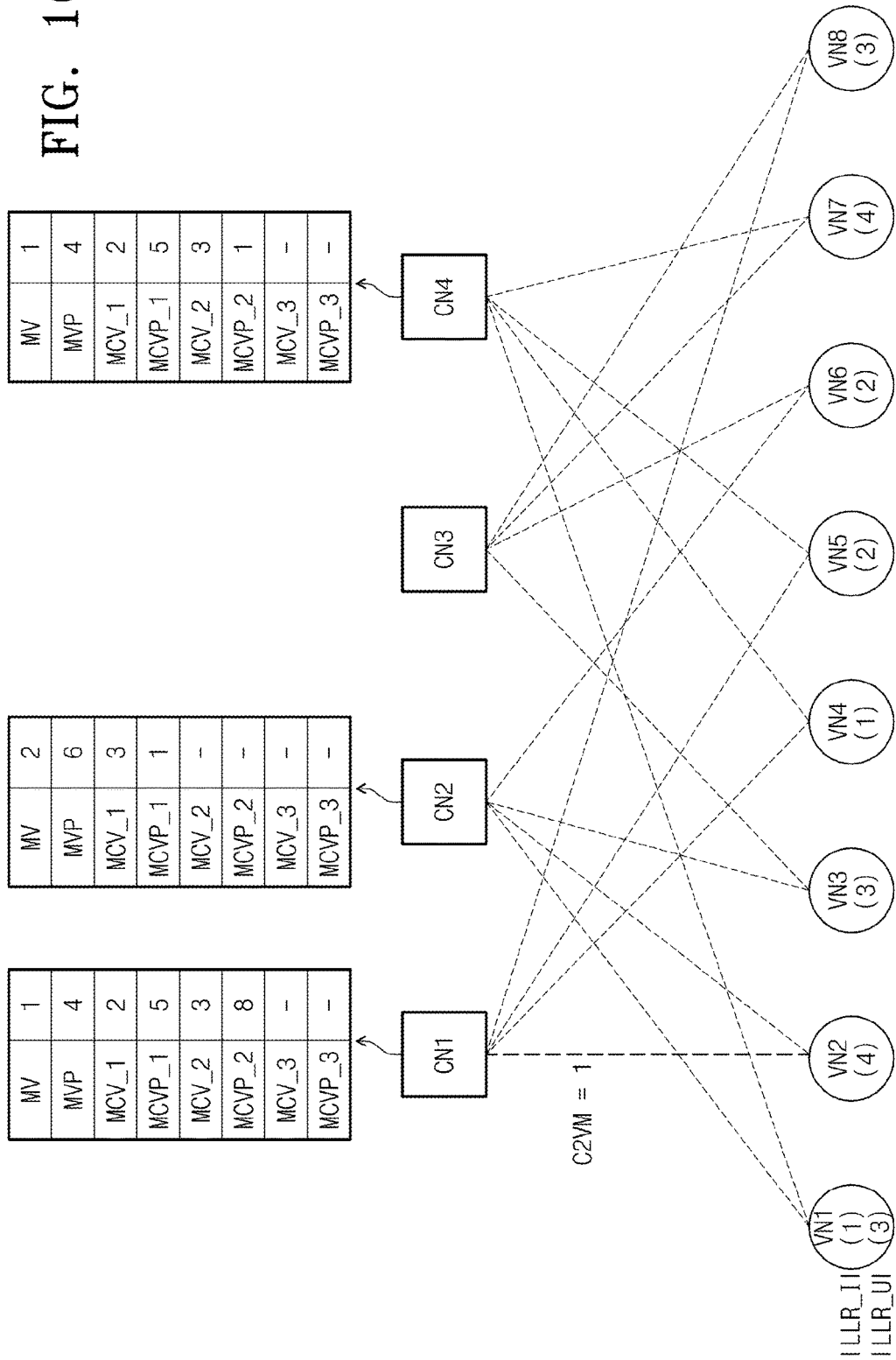

Referring to FIG. 16, a position of the second variable node VN2 selected is different from the minimum value position MVP of the first check node CN1. Thus, as described with reference to step S420 shown in FIG. 8, the second message calculator 150 outputs the minimum value MV of "1" as the second message C2VM from the first check node CN1.

A position of the second variable node VN2 selected is different from the minimum value position MVP, first minimum candidate value position MCVP_1, and second minimum candidate value position MCVP_2 of the first check node CN1. Thus, the check node updater 130 does not perform updating about the first check node (described with reference to FIG. 9).

Figure 17:
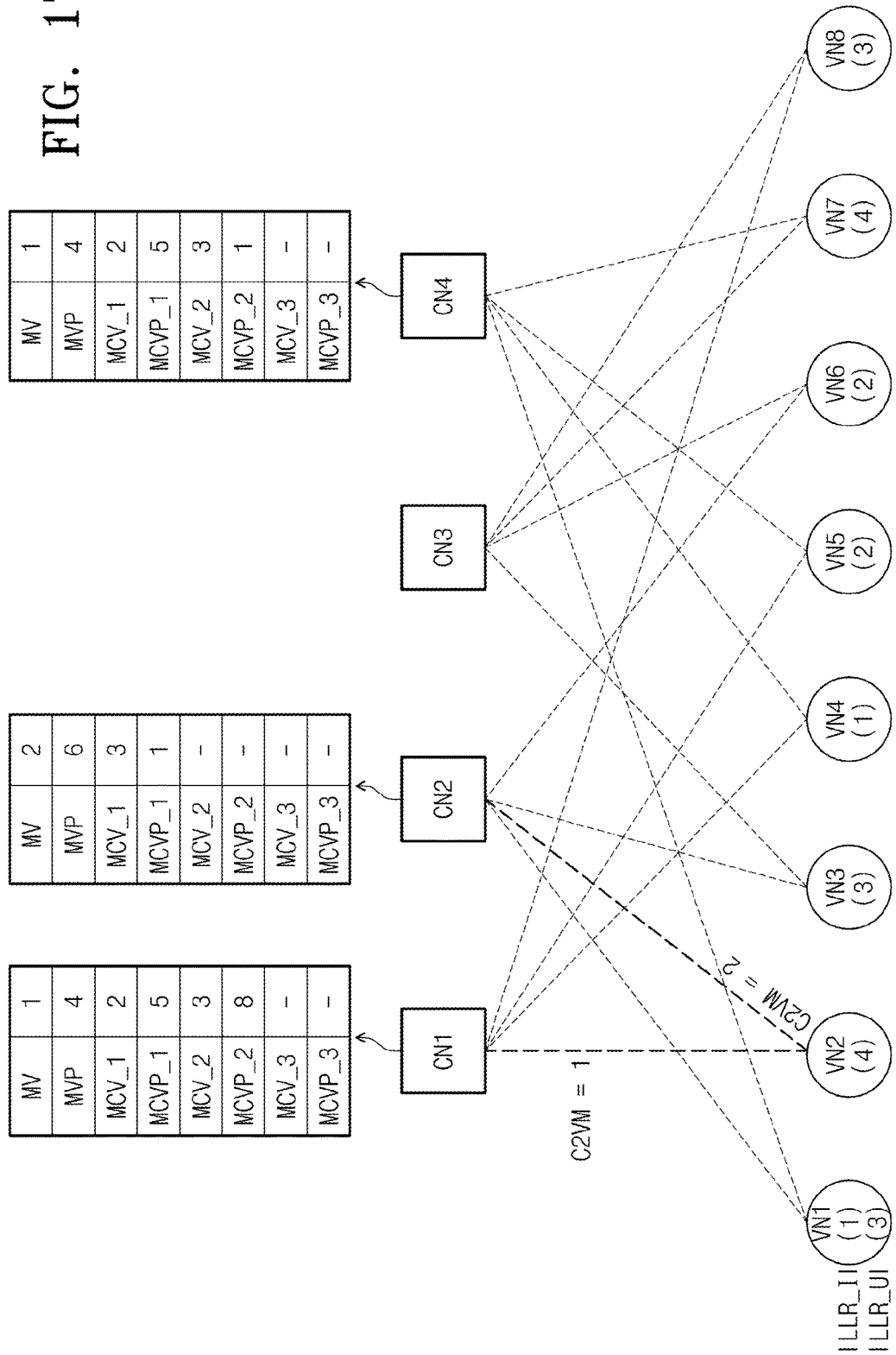

Referring to FIG. 17, a position of the second variable node VN2 selected is different from the minimum value position MVP of the second check node CN2. Thus, as described with reference to step S420 shown in FIG. 8, the second message calculator 150 outputs the minimum value MV of "2" as the second message C2VM from the second check node CN2.

A position of the second variable node VN2 selected is different from the minimum value position MVP and first minimum candidate value position MCVP_1 of the second check node CN2. Thus, the check node updater 130 does not perform updating about the second check node CN2 (described with reference to FIG. 9).

Figure 18:
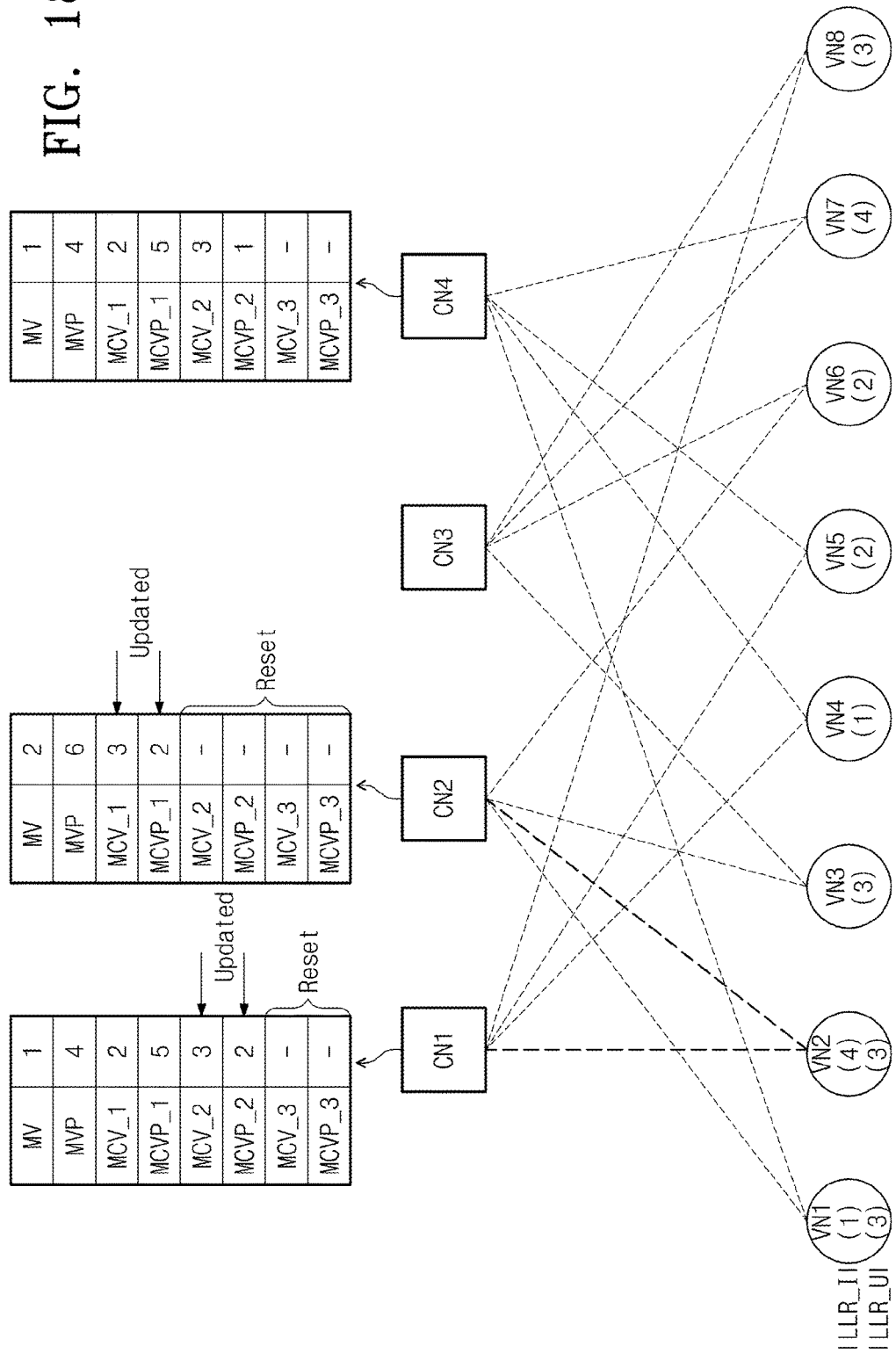

Referring to FIG. 18, the first message calculator 120 adds an initial log-likelihood value LLR of the second variable node VN1 selected, the second message C2VM from the first check node CN1, and the second message C2VM from the second check node CN2 to calculate an updated log-likelihood value LLR_U of the second variable node VN2 selected. Signs SIGN of log-likelihood values stored at the memory 140 are used upon calculating of the updated log-likelihood value LLR_U. For example, it is assumed that an absolute value of an updated log-likelihood value LLR_U of the second variable node VN2 is "3". The updated log-likelihood value LLR_U of the second variable node VN2 or the absolute value of the updated log-likelihood value LLR_U is stored at the buffer 161 of the decision unit 160. A sign SIGN of a log-likelihood value LLR of the second variable node VN2 stored at the memory 140 is updated when a sign of the updated log-likelihood value LLR_U of the second variable node VN2 is different from a sign of a log-likelihood value before updating, for example, a sign of the initial log-likelihood value LLR_I.

At the first check node CN1, the absolute value of the updated log-likelihood value LLR_U is greater than the second minimum candidate value MCV_2. As described with reference to the case that the variable K is "2" (refer to step S650 shown in FIG. 10), the second minimum candidate value MCV_2 of the first check node CN1 is updated with the absolute value of the updated log-likelihood value LLR_U. The second minimum candidate value position MCVP_2 of the first check node CN1 is updated with a position of the second variable node VN2 selected. Reset are a third minimum candidate value MCV_3 and a third minimum candidate value position MCVP_3 of the first check node CN1.

At the second check node CN2, the absolute value of the updated log-likelihood value LLR_U is equal to the first minimum candidate value MCV_1. As described with reference to the case that the variable K is "1" (refer to step S650 shown in FIG. 10), the first minimum candidate value MCV_1 of the second check node CN2 is updated with the absolute value of the updated log-likelihood value LLR_U. The first minimum candidate value position MCVP_1 of the second check node CN2 is updated with a position of the second variable node VN2 selected. Reset are second and third minimum candidate values MCV of the second check node CN2 and second and third minimum candidate value positions MCVP_2 and MCVP_3 associated therewith.

Figure 19:
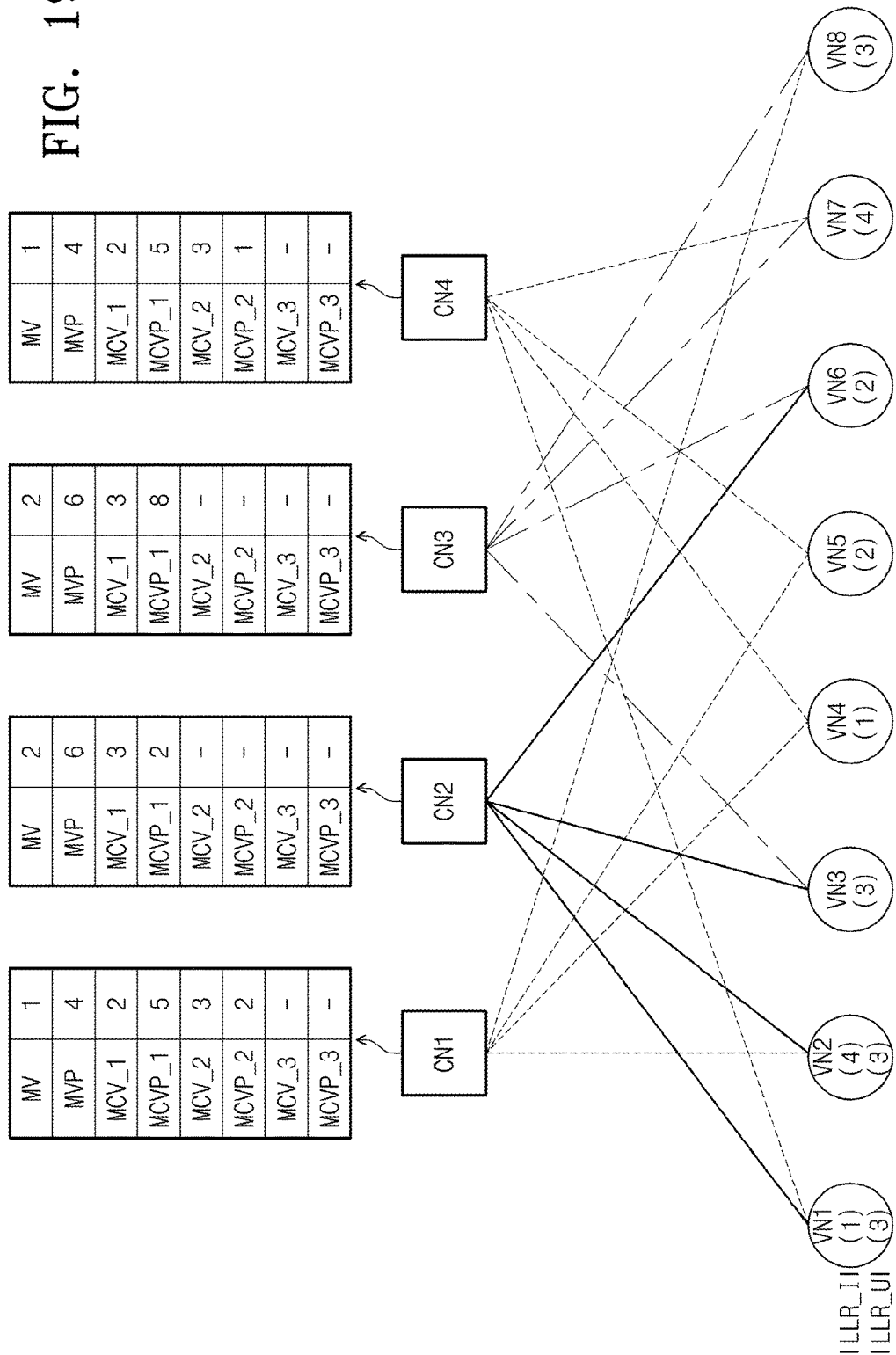

Referring to FIG. 19, the third variable node VN3 is selected for the error correction decoding. The third variable node VN3 is connected with a second check node CN2 and a third check node CN3. Sharing variable nodes of the second check node CN2 are the first variable node VN1, the second variable node VN2, the third variable node VN3, and the sixth variable node VN6. Sharing variable nodes of the third check node CN3 are the third variable node VN2, the sixth variable node VN6, the seventh variable node VN7, and the eighth variable node VN8.

A second message C2VM from the second check node CN2 and a second message C2VM from the third check node CN3 are necessary to update a log-likelihood value LLR of the third variable node VN3.

A minimum value MV, a minimum value position MVP, a minimum candidate value MCV, and a minimum candidate value position MCVP of the second check node CN2 previously exist.

Updating of a variable node is first performed at the sharing variable nodes VN3, VN6, VN7, and VN8 of the second check node CN2. The check node updater 130 detects the minimum value MV, minimum value position MVP, minimum candidate value MCV, and minimum candidate value position MCVP from the initial log-likelihood values LLR_I of the sharing variable nodes VN3, VN6, VN7, and VN8.

In exemplary embodiments, a method of detecting a minimum value MV, a minimum value position MVP, a minimum candidate value MCV, and a minimum candidate value position MCVP depending on the initial log-likelihood values LLR_I is substantially the same as a method described with reference to FIG. 10 except that an absolute value of an updated log-likelihood value LLR_U is replaced with an absolute value of an initial log-likelihood value LLR_I.

As illustrated in FIG. 19, at the third check node CN3, the minimum value MV is detected to be "2", the minimum value position MVP to be "6", a first minimum candidate value MCV_1 to be "3", and a first minimum candidate value position MCVP_1 to be "8".

Figure 20:
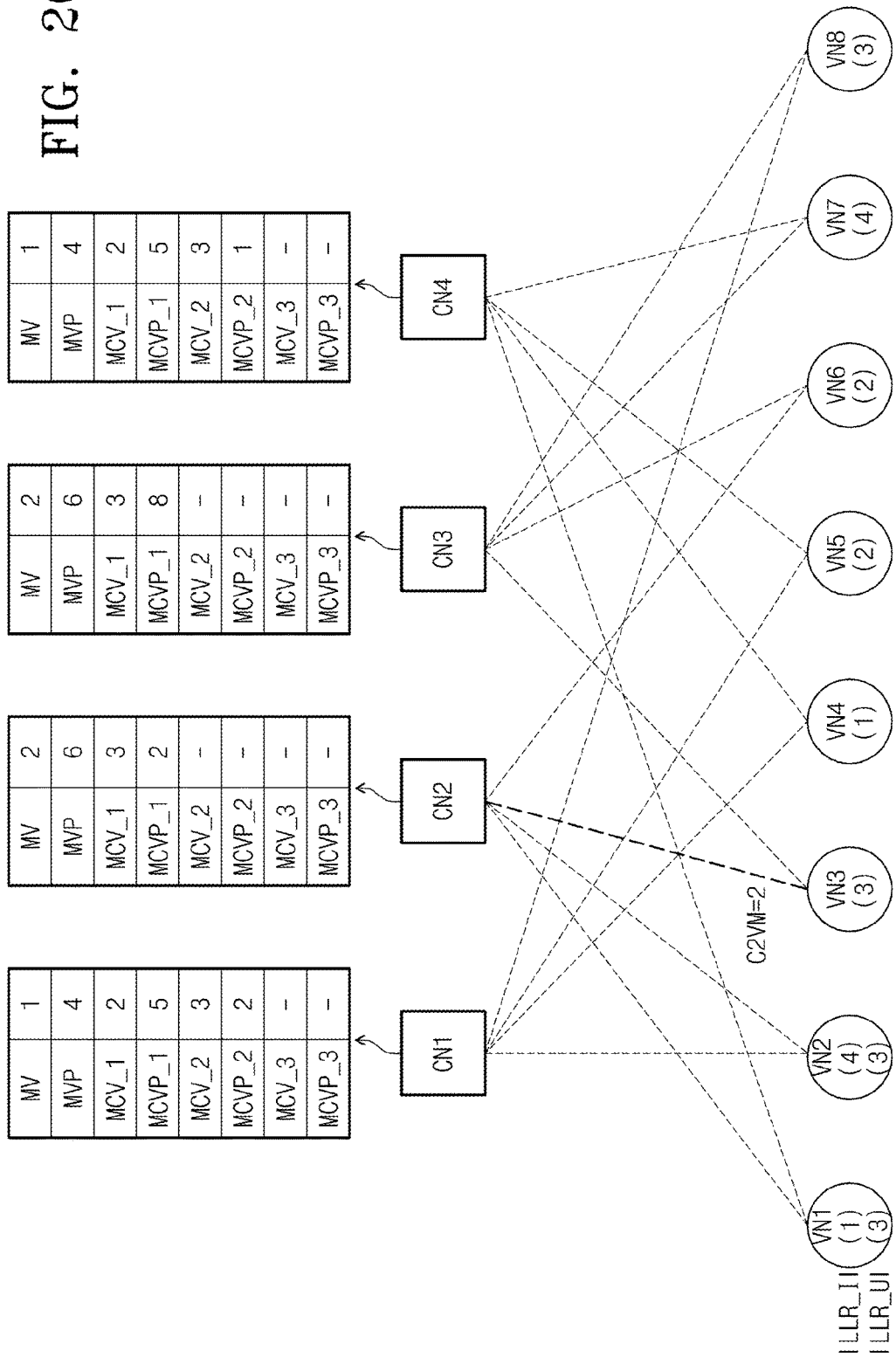

Referring to FIG. 20, a position of the third variable node VN3 selected is different from the minimum value position MVP of the second check node CN2. Thus, as described with reference to step S420 shown in FIG. 8, the second message calculator 150 outputs the minimum value MV of "2" as the second message C2VM from the second check node CN2.

The check node updater 130 does not perform updating about the second check node CN2 (described with reference to FIG. 9) because a position of the third variable node VN3 selected is different from the minimum value position MVP and the minimum candidate value position MCVP of the second check node CN2.

Figure 21:
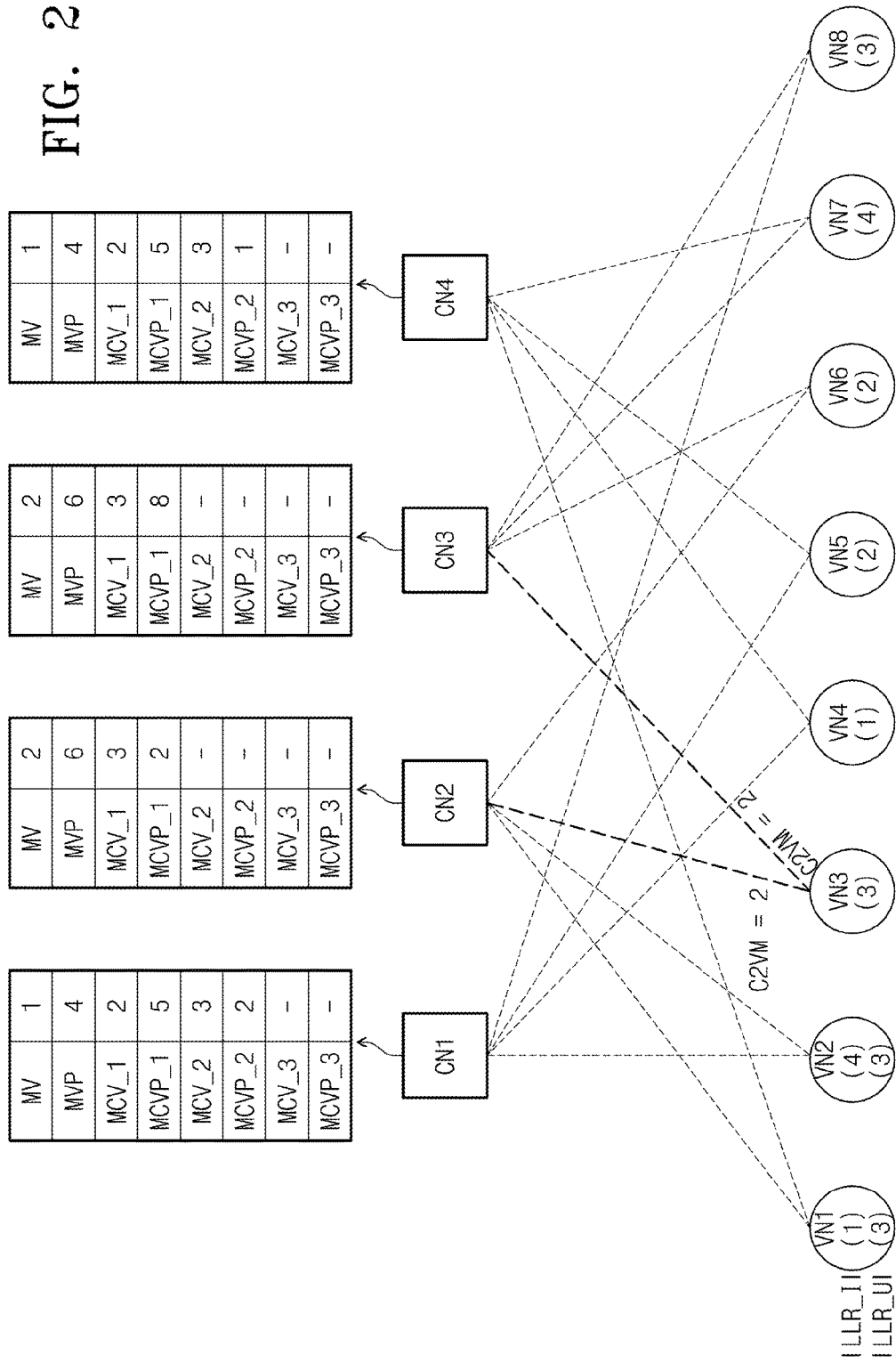

Referring to FIG. 21, a position of the third variable node VN3 selected is different from the minimum value position MVP of the third check node CN3. Thus, as described with reference to step S420 shown in FIG. 8, the second message calculator 150 outputs the minimum value MV of "2" as the second message C2VM from the third check node CN3.

The check node updater 130 does not perform updating about the third check node CN3 (described with reference to FIG. 9) because a position of the third variable node VN3 selected is different from the minimum value position MVP and he minimum candidate value position MCVP of the third check node CN3.

Figure 22:
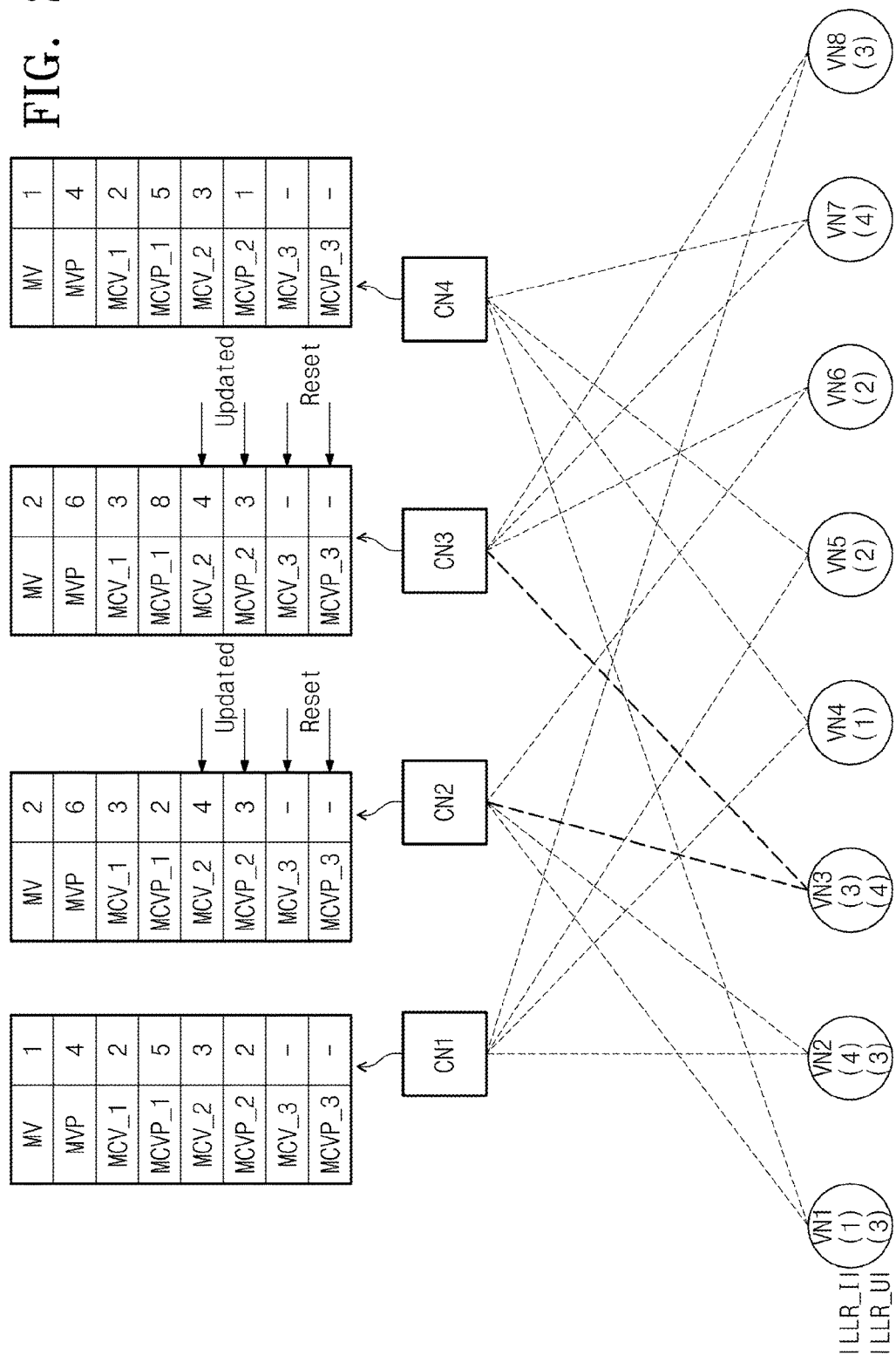

Referring to FIG. 22, the first message calculator 120 adds an initial log-likelihood value LLR of the third variable node VN3 selected, the second message C2VM from the second check node CN2, and the second message C2VM from the third check node CN3 to calculate an updated log-likelihood value LLR_U of the third variable node VN3 selected. Signs SIGN of log-likelihood values stored at the memory 140 are used upon calculating of the updated log-likelihood value LLR_U. For example, it is assumed that an absolute value of an updated log-likelihood value LLR_U of the third variable node VN3 is "4". The updated log-likelihood value LLR_U of the third variable node VN3 or the absolute value of the updated log-likelihood value LLR_U is stored at the buffer 161 of the decision unit 160. A sign SIGN of a log-likelihood value LLR of the third variable node VN3 stored at the memory 140 is updated when a sign of the updated log-likelihood value LLR_U of the third variable node VN3 is different from a sign of a log-likelihood value LLR before updating, for example, a sign of the initial log-likelihood value LLR_I.

At the second check node CN2, the absolute value of the updated log-likelihood value LLR_U is greater than the first minimum candidate value MCV_1, while the second minimum candidate value MCV_2 does not exist. As described with reference to the case that the variable K is "2" (refer to step S650 shown in FIG. 10), the second minimum candidate value MCV_2 of the second check node CN2 is updated with the absolute value of the updated log-likelihood value LLR_U. The second minimum candidate value position MCVP_2 of the second check node CN2 is updated with a position of the third variable node VN3 selected. Reset are a third minimum candidate value MCV_3 of the second check node CN2 and a third minimum candidate value position MCVP_3 associated therewith.

At the third check node CN3, the absolute value of the updated log-likelihood value LLR_U is greater than the first minimum candidate value MCV_1, while the second minimum candidate value MCV_2 does not exist. As described with reference to the case that the variable K is "2" (refer to step S650 shown in FIG. 10), the second minimum candidate value MCV_2 of the third check node CN3 is updated with the absolute value of the updated log-likelihood value LLR_U. The second minimum candidate value position MCVP_2 of the third check node CN3 is updated with a position of the third variable node VN3 selected. Reset are the third minimum candidate value MCV_3 of the third check node CN3 and a third minimum candidate value position MCVP_3 associated therewith.

As described above, an error correction decoder 100 calculates a second message C2VM by use of a minimum value MV, a minimum value position MVP, a minimum candidate value MCV, and a minimum candidate value position MCVP instead of the whole log-likelihood values of variable nodes. The complexity of the error correction decoder 100 is based on the number of minimum candidate values MCV and the number of minimum candidate value positions MCVP, not the number of check nodes CN, the number of variable nodes VN, and a connection relationship between the check nodes CN and the variable nodes VN. Thus, the error correction decoder 100 according to an embodiment of the application may be optimized for a storage environment where the number of bits per sample of data is small.

In embodiments of the application, an embodiment of the application is exemplified as when each sample of data is formed of Q bits, a minimum candidate value MCV is used as many as "$2^{(Q-1)}-1$". That is, an embodiment of the application is exemplified as a minimum value and a minimum candidate value MCV are used as many as "$2^{(Q-1)}-1$".

However, the number of minimum candidate values MCV the error correction decoder uses may be reduced. For example, the error correction decoder 100 may use minimum candidate values MCV of which the number is smaller by M than "$2^{(Q-1)}-1$" being the maximum number of minimum candidate values MCV. In this case, the complexity and size of the error correction decoder 100 may be further reduced.

Reducing the number of minimum candidate values MCV may be viewed as a type of approximation. However, a conventional approximation-based error correction decoder performs error correction by use of the predetermined number of log-likelihood values regardless of types of log-likelihood values. However, if approximation is applied to the error correction decoder 100 according to an embodiment of the application, the error correction decoder 100 corrects an error using the predetermined number of log-likelihood values. The used log-likelihood values (i.e., minimum value MV and minimum candidate value MCV) are not duplicated. Thus, it is possible to minimize information omitted due to the approximation and to optimize error correction efficiency of the error correction decoder 100.

Figure 23:
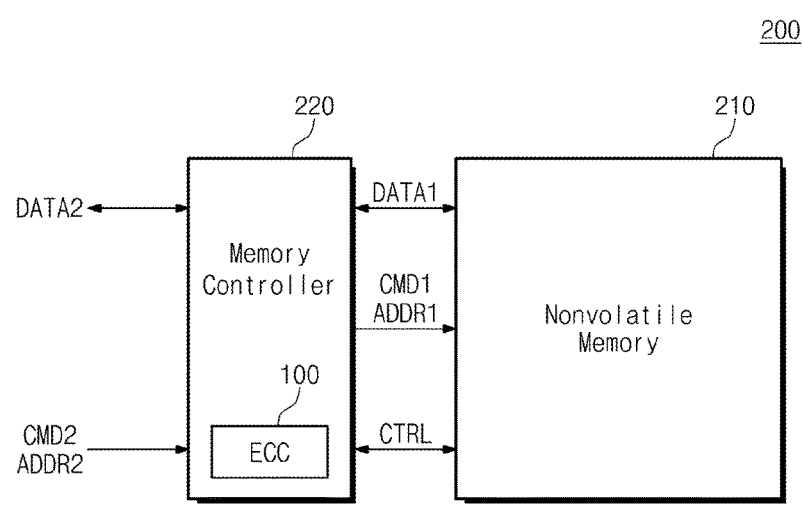
FIG. 23 is a block diagram schematically illustrating a storage device according to an embodiment of the application.

FIG. 23 is a block diagram schematically illustrating a storage device 200 according to an embodiment of the application. Referring to FIG. 23, a storage device 200 contains a nonvolatile memory 210 and a memory controller 220.

The nonvolatile memory 210 performs read, write, and erase operations according to a control of the memory controller 220. The nonvolatile memory 210 exchanges first data DATA1 with the memory controller 220. For example, the nonvolatile memory 210 receives write data from the memory controller 220 and stores the write data. The nonvolatile memory 210 performs a read operation and outputs the read data to the memory controller 220.

The nonvolatile memory 210 receives a first command CMD1 and a first address ADDR1 from the memory controller 220. The nonvolatile memory 210 exchanges a control signal CTRL with the memory controller 120. For example, the nonvolatile memory 210 receives, from the memory controller 220, at least one of a chip selection signal/CE for selecting at least one of a plurality of semiconductor devices constituting the nonvolatile memory 210, a command latch enable signal CLE indicating that a signal received from the memory controller 220 is the first command CMD1, an address latch enable signal ALE indicating that a signal received from the memory controller 220 is the first address ADDR1, a read enable signal/RE received from the memory controller 220 at a read operation, periodically toggled, and used to tune timing, a write enable signal/WE activated by the memory controller 220 when the first command CMD1 or the first address ADDR1 is transmitted, a write protection signal/WP activated by the memory controller 220 to prevent unintended writing or erasing when power changes, and a data strobe signal DQS used to adjust input synchronization of the first data DATA1 and generated from the memory controller 220 at a write operation so as to be periodically toggled. For example, the nonvolatile memory 210 outputs, to the memory controller 220, at least one of a ready/busy signal R/nB indicating whether the nonvolatile memory 210 is performing a program, erase or read operation and a data strobe signal DQS used to adjust output synchronization of the first data DATA1 and generated from the read enable signal/RE by the nonvolatile memory 210 so as to be periodically toggled.

The nonvolatile memory 210 may include a flash memory. However, the scope and spirit of the application may not be limited thereto. For example, the nonvolatile memory 210 may incorporate at least one of nonvolatile memories, such as PRAM (Phase-change RAM), MRAM (Magnetic RAM), RRAM (Resistive RAM), FeRAM (Ferroelectric RAM), and so on.

In an embodiment of the present application, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present application, the 3D memory array includes vertical NAND strings that are vertically oriented such that at least one memory cell is located over another memory cell. The at least one memory cell may comprise a charge trap layer. Each vertical NAND string further includes at least one select transistor located over memory cells, the at least one select transistor having the same structure with the memory cells and being formed monolithically together with the memory cells.

The following patent documents, the entireties of which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The memory controller 220 controls the nonvolatile memory 210. For example, the nonvolatile memory 210 performs a write, read, or erase operation according to a control of the memory controller 220. The memory controller 220 exchanges the first data DATA1 and the control signal CTRL with the nonvolatile memory 210 and outputs the first command CMD1 and the first address ADDR1 to the nonvolatile memory 210.

The memory controller 220 controls the nonvolatile memory 210 according to a control of an external host device (not shown). The memory controller 220 exchanges second data DATA2 with the host device and receives a second command CMD2 and a second address ADDR2 therefrom.

The memory controller 220 receives the second data DATA2 from the host device and writes the second data DATA2 at the nonvolatile memory 210 as the first data DATA1. The memory controller 220 receives the first data DATA1 from the nonvolatile memory 210 and outputs the first data DATA1 to the host device as the second data DATA2. In exemplary embodiments, the memory controller 220 exchanges the first data DATA1 with the nonvolatile memory 210 by a first unit, and it exchanges the second data DATA2 with the host device by a second unit different from the first unit.

The memory controller 220 exchanges the first data DATA1 with the nonvolatile memory 210 in compliance with the first format and sends the first command CMD1 and the first address ADDR1 to the nonvolatile memory 210. The memory controller 220 exchanges the second data DATA2 with the host device in compliance with the second format different from the first format and receives the second command CMD2 and the second address ADDR2 from the host device.

The memory controller 220 includes an error correction decoder 100. The error correction decoder 100 corrects an error of the first data DATA1 read from the nonvolatile memory 210. The error correction decoder 100 may include an error correction decoder 100 according to an embodiment of the application described with reference to FIGS. 1 through 22. In exemplary embodiments, a sample that the error correction decoder 100 receives may a result of a read operation that is performed using different read voltages of levels that are adjacent to a level between two threshold voltage distributions, just adjacent to each other, from among threshold voltage distributions of memory cells of the nonvolatile memory 210.

In exemplary embodiments, the error correction decoder 100 may be included in the nonvolatile memory 210, not memory controller 220. The nonvolatile memory 210 may output data of which the error is corrected using the error correction decoder 100, to the memory controller 220 as the first data DATA1.

The storage device 200 performs an operation of writing, reading or erasing data according to a request of the host device. The storage device 200 may include a solid state drive (SSD) or a hard disk drive (HDD). The storage device 200 may include memory cards, such as PC card (PCMCIA, personal computer memory card international association), compact flash card, smart media card (SM, SMC), memory stick, multimedia card (MMC, RS-MMC, MMCmicro), SD card (SD, miniSD, microSD, SDHC), USB (Universal Serial Bus) memory card, and universal flash storage (UFS). The storage device 100 may include embedded memories, such as eMMC (embedded MultiMedia Card), UFS, and PPN (Perfect Page New).

Figure 24:
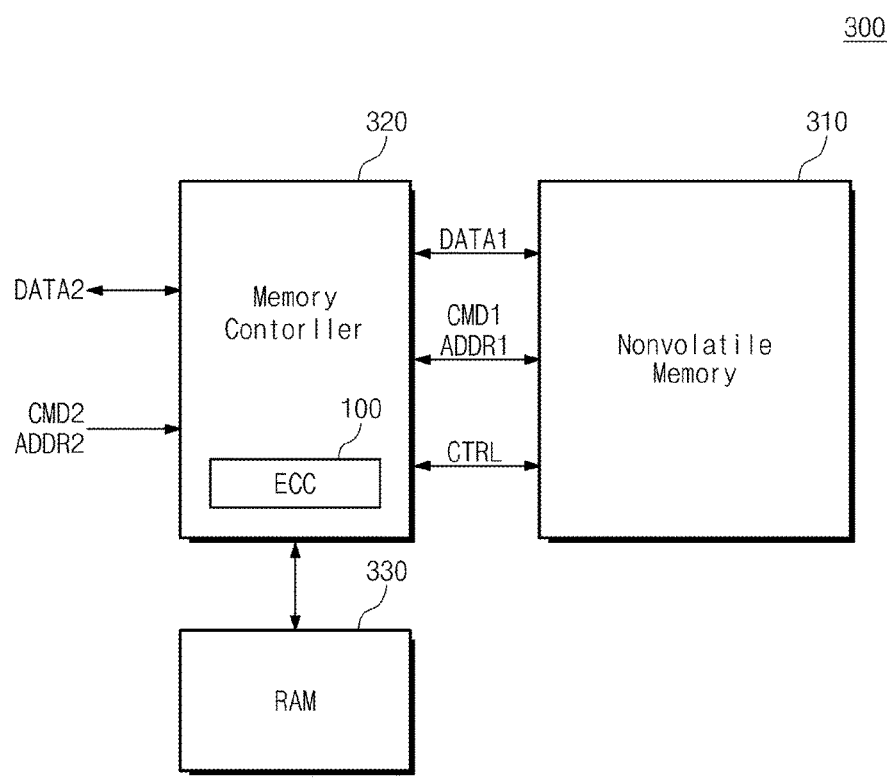
FIG. 24 is a block diagram schematically illustrating a storage device according to another embodiment of the application.

FIG. 24 is a block diagram schematically illustrating a storage device 300 according to another embodiment of the application. Referring to FIG. 24, a storage device 300 contains a nonvolatile memory 310, a memory controller 320, and a RAM 330.

The RAM 330 may include at least one of a variety of random access memories, such as, but not limited to, a static RAM, a dynamic RAM, a synchronous DRAM (SRAM), a Phase-change RAM (PRAM), a Magnetic RAM (MRAM), a Resistive RAM (RRAM), and a Ferroelectric RAM (FRAM).

The memory controller 320 uses the RAM 330 as a buffer memory, a cache memory, or a working memory. For example, the memory controller 320 receives second data DATA2 from a host device, stores the second data DATA2 at the RAM 330, and writes the second data DATA2 stored at the RAM 330 at the nonvolatile memory 310 as the first data DATA1. The memory controller 320 reads the first data DATA1 from the nonvolatile memory 310, stores the first data DATA1 received at the RAM 330, and outputs the first data DATA1 stored at the RAM 330 to the host device as the second data DATA2. The memory controller 330 stores data read from the nonvolatile memory 310 at the RAM 330 and writes the data stored at the RAM 330 back at the nonvolatile memory 310.

The memory controller 320 contains an error correction decoder 100 according to an embodiment of the application. In other exemplary embodiments, the error correction decoder 100 may be included in the nonvolatile memory 310.

Figure 25:
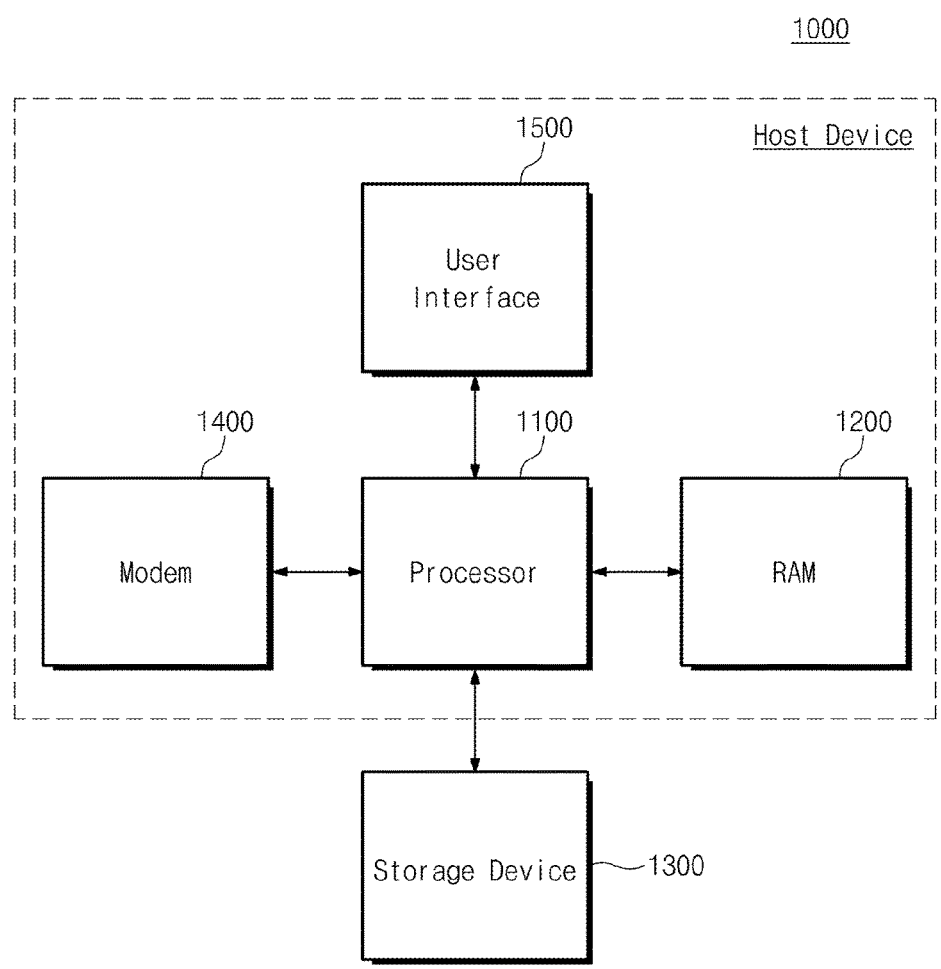
FIG. 25 is a block diagram schematically illustrating a computing device according to an embodiment of the application.

FIG. 25 is a block diagram schematically illustrating a computing device 1000 according to an embodiment of the application. Referring to FIG. 25, a computing device 1000 includes a processor 1100, a memory 1200, a storage device 1300, a modem 1400, and a user interface 1500.

The processor 1100 controls an overall operation of the computing device 1000 and performs a logical operation.

The processor 1100 is formed of a system-on-chip (SoC). The processor 1100 may be a general purpose processor, a specific-purpose processor, or an application processor.

As the memory 1200, a RAM 1200 communicates with the processor 1100. The RAM 1200 may be a main memory of the processor 1100 or the computing device 1000. The processor 1100 stores codes or data in the RAM 1200 temporarily. The processor 1100 executes codes using the RAM 1200 to process data. The processor 1100 executes a variety of software, such as, but not limited to, an operating system and an application, by use of the RAM 1200. The processor 1100 controls an overall operation of the computing device 1000 by use of the RAM 1200. The RAM 1200 may include a volatile memory such as, but not limited to, a static RAM, a dynamic RAM, and a synchronous DRAM or a nonvolatile memory such as, but not limited to, a Phase-change RAM (PRAM), a Magnetic RAM (MRAM), a Resistive RAM (RRAM), and a Ferroelectric RAM (FRAM).

The storage device 1300 communicates with the processor 1100. The storage device 1300 is used to store data for a long time. That is, the processor 1110 stores data, which is to be stored for a long time, in the storage device 1300. The storage device 1300 stores a boot image for driving the computing device 1000. The storage device 1300 stores source codes of a variety of software, such as an operating system and an application. The storage device 2300 stores data that is processed by a variety of software, such as an operating system and an application.

In exemplary embodiments, the processor 1100 loads source codes stored in the storage device 1300 on the RAM 1200. The codes loaded on the RAM 1200 are executed to run a variety of software, such as an operating system and an application. The processor 1100 loads data stored in the storage device 1300 on the RAM 1200 and processes data loaded on the RAM 1200. The processor 1100 stores long-term data of data stored in the RAM 1200 at the storage device 1300.

The storage device 1300 includes a nonvolatile memory, such as, but not limited to, a flash memory, a PRAM (Phase-change RAM), an MRAM (Magnetic RAM), an RRAM (Resistive RAM), or an FRAM (Ferroelectric RAM).

The modem 1400 communicates with an external device according to a control of the processor 1100. For example, the modem 2400 communicates with the external device in a wire or wireless manner. The modem 2400 may communicate with the external device, based on at least one of wireless communications manners such as LTE (Long Term Evolution), WiMax, GSM (Global System for Mobile communication), CDMA (Code Division Multiple Access), Bluetooth, NFC (Near Field Communication), WiFi, and RFID (Radio Frequency Identification or wire communications manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2O (Inter-integrated Circuit), HS-I2C, I2S, (Integrated-interchip Sound), S/PDIF (Sony/Philips Digital Interface), MMC (MultiMedia Card), and eMMC (embedded MMC).

The user interface 1500 communicates with a user under control of the processor 1100. For example, the user interface 1500 may include user input interfaces such as a keyboard, a keypad, a button, a touch panel, a touch screen, a touch pad, a touch ball, a camera, a microphone, a gyroscope sensor, and a vibration sensor. The user interface 1500 may further include user output interfaces such as an LCD, an OLED (Organic Light Emitting Diode) display device, an AMOLED (Active Matrix OLED) display device, an LED, a speaker, and a motor.

The storage device 1300 may include at least one of storage devices 100 and 200 according to embodiments of the application. The processor 1100, RAM 1200, modem 1400, and user interface 1500 may constitute a host device that communicates with the storage device 1300.

According to embodiments of the application, an error correction decoder performs decoding by use of a minimum value, a minimum value position, a minimum candidate value, and a minimum candidate value position. Nevertheless, the error correction decoder has the same error correction capacity as that using all log-likelihood values.

While the application has been described with reference to exemplary embodiments, it will be apparent to those skilled in the art that various changes and modifications may be made without departing from the spirit and scope of the present application. Therefore, it should be understood that the above embodiments are not limiting, but illustrative.

What is claimed is:

1. An operating method executed by an error correction decoder within a storage device comprising a nonvolatile memory and the error correction decoder, the method comprising:
    receiving data from the nonvolatile memory;
    setting initial log-likelihood values of variable nodes depending on the received data; and
    decoding the received data by updating a log-likelihood value of a selected variable node by use of a minimum value and a minimum candidate value associated with the selected variable node, wherein:
    the minimum value indicates a minimum value of absolute values of log-likelihood values of first variable nodes sharing a check node with the selected variable node and including the selected variable node, and
    the minimum candidate value indicates one from among absolute values of log-likelihood values of second variable nodes that is the smallest value greater than the minimum value, and
    the second variable nodes are selected later than one from among the first variable nodes that corresponds to the minimum value.

2. The operating method of claim 1, wherein:
    the log-likelihood value of the selected variable node is updated additionally using a minimum value position and a minimum candidate value position,
    the minimum value position indicates a position of one from among the first variable nodes that corresponds to the minimum value and is selected last, and
    the minimum candidate value position indicates a position of one from among the second variable nodes that corresponds to the minimum candidate value and is selected last.

3. The operating method of claim 2, wherein the decoding the received data includes detecting the minimum value and the minimum candidate value from the initial log-likelihood values of the first variable nodes when the selected variable node is one from among the first variable nodes that is first updated.

4. The operating method of claim 3, wherein:
    the decoding the received data further includes:
    detecting a second minimum candidate value from among absolute values of log-likelihood values of third variable nodes that is the smallest value greater than the minimum candidate value, wherein the third variable nodes are selected later than one from among the second variable nodes that correspond to the minimum candidate value, and
    detecting a K-th minimum candidate value from among log-likelihood values of K+1st variable nodes that is the smallest value greater than a K−1st minimum candidate value, wherein the K+1st variable nodes are selected later than one from among K-th variable nodes corresponding to the K−1st minimum candidate value,
    K is a positive integer of 3 or more, and
    the detecting a K-th minimum candidate value is repeated until the number of the minimum candidate values and the minimum value have different absolute log-likelihood values.

5. The operating method of claim 2, wherein the decoding the received data includes:
    calculating a first message corresponding to the selected variable node using the minimum value, the minimum value position, the minimum candidate value, and the minimum candidate value position;
    updating a log-likelihood value of the selected variable node depending on the first message; and
    updating the minimum value, the minimum value position, the minimum candidate value, and the minimum candidate value position according to an updating result of the log-likelihood value of the selected variable node.

6. The operating method of claim 5, wherein the calculating a first message includes:
    calculating the minimum candidate value as the first message when a position of the selected variable node is identical to the minimum value position; and
    calculating the minimum value as the first message when a position of the selected variable node is different from the minimum value position.

7. The operating method of claim 5, wherein the updating a log-likelihood value of the selected variable node includes:
    calculating a second message associated with another check node to which the selected variable node belongs; and
    updating the log-likelihood value of the selected variable node with a value obtained by calculating an initial log-likelihood value of the selected variable node, the first message, and the second message.

8. The operating method of claim 7, wherein the second message is calculated using log-likelihood values of variable nodes sharing the other check node with the selected variable node and including the selected variable node.

9. The operating method of claim 5, wherein in the updating the minimum value, the minimum value position, the minimum candidate value, and the minimum candidate value position, the minimum value and the minimum value position are set to have contents of the minimum candidate value and contents of the minimum candidate value position when a position of the selected variable node is identical to the minimum value position.

10. The operating method of claim 9, wherein:
    in the updating the minimum value, the minimum value position, the minimum candidate value, and the minimum candidate value position, when a position of the selected variable node is identical to the minimum value position, the minimum candidate value and the minimum candidate value position are set to have contents of a second minimum candidate value and contents of a second minimum candidate value position, a K-th minimum candidate value and a K-th minimum candidate value position are set to have contents of a K+1st minimum candidate value and contents of a K+1st minimum candidate value position, a last minimum candidate value and a last minimum candidate value position are reset, K is a positive integer of 2 or more, the K-th minimum candidate value is one from among absolute values of log-likelihood values of variable nodes that is the smallest value greater than a K−1st minimum candidate value, wherein the variable nodes are selected later than a variable node from among the first variable nodes corresponding to a K−1st minimum candidate value, and the K-th minimum candidate value position indicates a position of one from among the first variable nodes that is most recently updated and has the K-th minimum candidate value.

11. The operating method of claim 5, wherein:

in the updating the minimum value, the minimum value position, the minimum candidate value, and the minimum candidate value position, when a position of the selected variable node is identical to the minimum candidate value position, the minimum candidate value and the minimum candidate value position are set to have contents of a second minimum candidate value and contents of a second minimum candidate value position, and the second minimum candidate value is one from among log-likelihood values of variable nodes that has the smallest value greater than the minimum candidate value, wherein the variable nodes are selected later than the minimum candidate value from among the first variable nodes, and the second minimum candidate value position indicates a position of one from among the first variable nodes that is most recently updated and has the second minimum candidate value.

12. The operating method of claim 5, wherein in updating the minimum value, the minimum value position, the minimum candidate value, and the minimum candidate value position, when the updated log-likelihood value of the selected variable node is smaller than or equal to the minimum value, the minimum value is updated with the updated log-likelihood value, the minimum value position is updated with a position of the selected variable node, and the minimum candidate value and the minimum candidate value position are reset.

13. The operating method of claim 5, wherein:

in updating the minimum value, the minimum value position, the minimum candidate value, and the minimum candidate value position, when the updated log-likelihood value of the selected variable node is greater than the minimum value and smaller than or equal to the minimum candidate value, the minimum candidate value is updated with the updated log-likelihood value, the minimum candidate value position is updated with a position of the selected variable node, and K-th through last minimum candidate values and K-th through last minimum candidate value positions are reset, K is an integer of 2 or more, the K-th minimum candidate value is one from among absolute values of log-likelihood values of variable nodes that has the smallest value greater than a K−1st minimum candidate value, wherein the variable nodes are selected later than a variable node from among the first variable nodes corresponding to a K−1st minimum candidate value, and the K-th minimum candidate value position indicates a position of one from among the first variable nodes that is most recently updated and has the K-th minimum candidate value.

14. The operating method of claim 1, wherein:

the decoding is iterated while sequentially selecting the variable nodes, when data corresponding to the updated log-likelihood values of the variable nodes is error-corrected data, the error-corrected data is output, and when data corresponding to the updated log-likelihood values of the variable nodes is not the error-corrected data, the decoding is again iterated while sequentially selecting the variable nodes.

15. A storage device comprising:

a nonvolatile memory; and an error correction decoder adapted to correct an error of data read from the nonvolatile memory, wherein:

the error correction decoder includes:

a log-likelihood value generator adapted to set initial log-likelihood values of variable nodes according to the read data;

a first message generator adapted to update log-likelihood values of the variable nodes according to the initial log-likelihood values from the log-likelihood value generator and second messages and output the updated log-likelihood values as first messages;

a check node updater adapted to store a minimum value and a minimum candidate value from among the log-likelihood values of the first messages corresponding to each of a plurality of check nodes and update the minimum value and the minimum candidate value corresponding to each check node according to the first messages; and a second message generator adapted to generate the second messages using the minimum value and the minimum candidate value corresponding to each check node, the minimum value indicates a minimum value of absolute values of log-likelihood values of first variable nodes sharing a check node, the minimum candidate value indicates one from among absolute values of log-likelihood values of second variable nodes that has the smallest value greater than the minimum value, and the second variable nodes are selected later than one from among the first variable nodes corresponding to the minimum value.

16. The storage device of claim 15, wherein:

when the initial log-likelihood values are first received from the log-likelihood value generator, the first message generator outputs the initial log-likelihood values as the first messages, and the first message generator calculates the initial log-likelihood values and the second messages to generate a calculation result and again outputs the calculation result as the first messages.

17. The storage device of claim 15, wherein:
the error correction decoder updates a log-likelihood value of a first variable node depending on the first variable node and two or more check nodes associated with the first variable node and then updates a log-likelihood value of a second variable node depending on the second variable node and two or more check nodes associated with the second variable node, and
the updated log-likelihood value of the first variable node is used upon updating of the log-likelihood value of the second variable node.

18. The storage device of claim 15, wherein:
the check node updater stores the minimum value, the minimum candidate value, a minimum value position, and a minimum candidate value position corresponding to each check node,
the minimum value position indicates a position of one from among the first variable nodes that is selected last and corresponds to the minimum value, and
the minimum candidate value position indicates a position of one from among the first variable nodes that is selected last and corresponds to the minimum candidate value.

19. The storage device of claim 15, wherein:
the second message generator compares a position of a selected variable node with minimum value positions of check nodes associated with the selected variable node,
the second message generator outputs the minimum candidate value of the check node as a second message of the check node when a minimum value position of a check node connected with the selected variable node is identical to a position of the variable node, and
the second message generator outputs the minimum value of the check node as the second message of the check node when the minimum value position of the check node connected with the selected variable node is different from the position of the variable node.

20. A low density parity check method executed by an error correction decoder, the method comprising:

a) associating each of k check nodes with multiple ones of n variable nodes according to bit values of a parity check matrix, such that:
each of the variable nodes represents a different column of the parity check matrix and each of the check nodes represents a different row of the parity check matrix,
for each row of the parity check matrix, every true bit value in the row indicates that the variable node representing the column in which the true bit value exists is associated with the check node representing the row,
for each row of the matrix parity check, every false bit value in the row indicates that the variable node representing the column in which the false bit value exists is not associated with the check node representing the row,
each variable node is associated with at least two check nodes, and
n and k are integers such that n>k;
b) storing a log-likelihood value of each of n bits of a bit string in a different one of the variable nodes;
c) sequentially updating the log-likelihood value stored in each variable node, in a loop that begins with a 1st variable node and ends with a nth variable node, based upon an update value provided by each check node associated with the variable node;
d) determining whether the n updated log-likelihood values represent an n-bit codeword having no detected bit errors; and
e) repeating operations (c) and (d) until a determination is made that an o-bit codeword having no detected bit errors exists or a predetermined number of loops has occurred, wherein
the absolute value of the update value provided by each check node is never less than the absolute value of the smallest log-likelihood value presently stored in any one of the variable nodes associated with the check node.

* * * * *